(12) United States Patent
Kuo et al.

(10) Patent No.: US 8,501,572 B2
(45) Date of Patent: Aug. 6, 2013

(54) SPACER STRUCTURE FOR TRANSISTOR DEVICE AND METHOD OF MANUFACTURING SAME

(75) Inventors: Chun-Tsung Kuo, Tainan (TW); Shih-Chang Liu, Kaoshiung County (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 380 days.

(21) Appl. No.: 12/874,362

(22) Filed: Sep. 2, 2010

(65) Prior Publication Data

US 2012/0056305 A1    Mar. 8, 2012

(51) Int. Cl.
*H01L 21/331* (2006.01)
(52) U.S. Cl.
USPC ........... 438/348; 438/309; 438/353; 257/197; 257/517; 257/526; 257/E29.114
(58) Field of Classification Search
None
See application file for complete search history.

(56) References Cited

U.S. PATENT DOCUMENTS

| | | | |
|---|---|---|---|
| 6,924,202 B2 | 8/2005 | Li et al. | |
| 6,989,557 B2 * | 1/2006 | Chen | 257/197 |
| 7,022,578 B2 | 4/2006 | Verma et al. | |
| 7,132,344 B1 | 11/2006 | Knorr | |
| 2003/0027397 A1 | 2/2003 | Gau | |
| 2005/0079658 A1 * | 4/2005 | Li et al. | 438/189 |
| 2011/0133289 A1 * | 6/2011 | Kerr et al. | 257/370 |

* cited by examiner

*Primary Examiner* — Tan N Tran
*Assistant Examiner* — Scott R Wilson
(74) *Attorney, Agent, or Firm* — Haynes and Boone, LLP

(57) ABSTRACT

The present disclosure provides a bipolar junction transistor (BJT) device and methods for manufacturing the BJT device. In an embodiment, the BJT device includes: a semiconductor substrate having a collector region, and a material layer disposed over the semiconductor layer. The material layer has a trench therein that exposes a portion of the collector region. A base structure, spacers, and emitter structure are disposed within the trench of the material layer. Each spacer has a top width and a bottom width, the top width being substantially equal to the bottom width.

20 Claims, 20 Drawing Sheets

US 8,501,572 B2

SPACER STRUCTURE FOR TRANSISTOR DEVICE AND METHOD OF MANUFACTURING SAME

BACKGROUND

A bipolar junction transistor (BJT) is a three-terminal device. The three terminals include a base terminal, a collector terminal, and an emitter terminal. BJTs are formed by two p-n junctions placed back-to-back in close proximity to each other, with one of the regions common to both junctions. There is a first junction between the base and the emitter, and a second junction between the emitter and the collector. This forms either a p-n-p or n-p-n transistor depending upon the characteristics of the semiconductive materials used to form the BJT. The terminals of the BJT are connected to their respective base, collector, and emitter. In BJTs, the current flow through the emitter and collector terminals is controlled by the voltage across the base and emitter terminals. Various techniques have been implemented to improve transistor device performance. For example, heterojunction bipolar transistors (HBT) have been fabricated. HBTs are BJTs where the emitter-base junction is formed from two different semiconductive materials having similar characteristics. Because the HBTs are formed of two different semiconductor materials, the energy band gaps, as well as other material properties, can be different in the emitter, base, and collector. Accordingly, improved transistor device performance is achieved, such as higher cut-off frequency values. However, although existing approaches have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
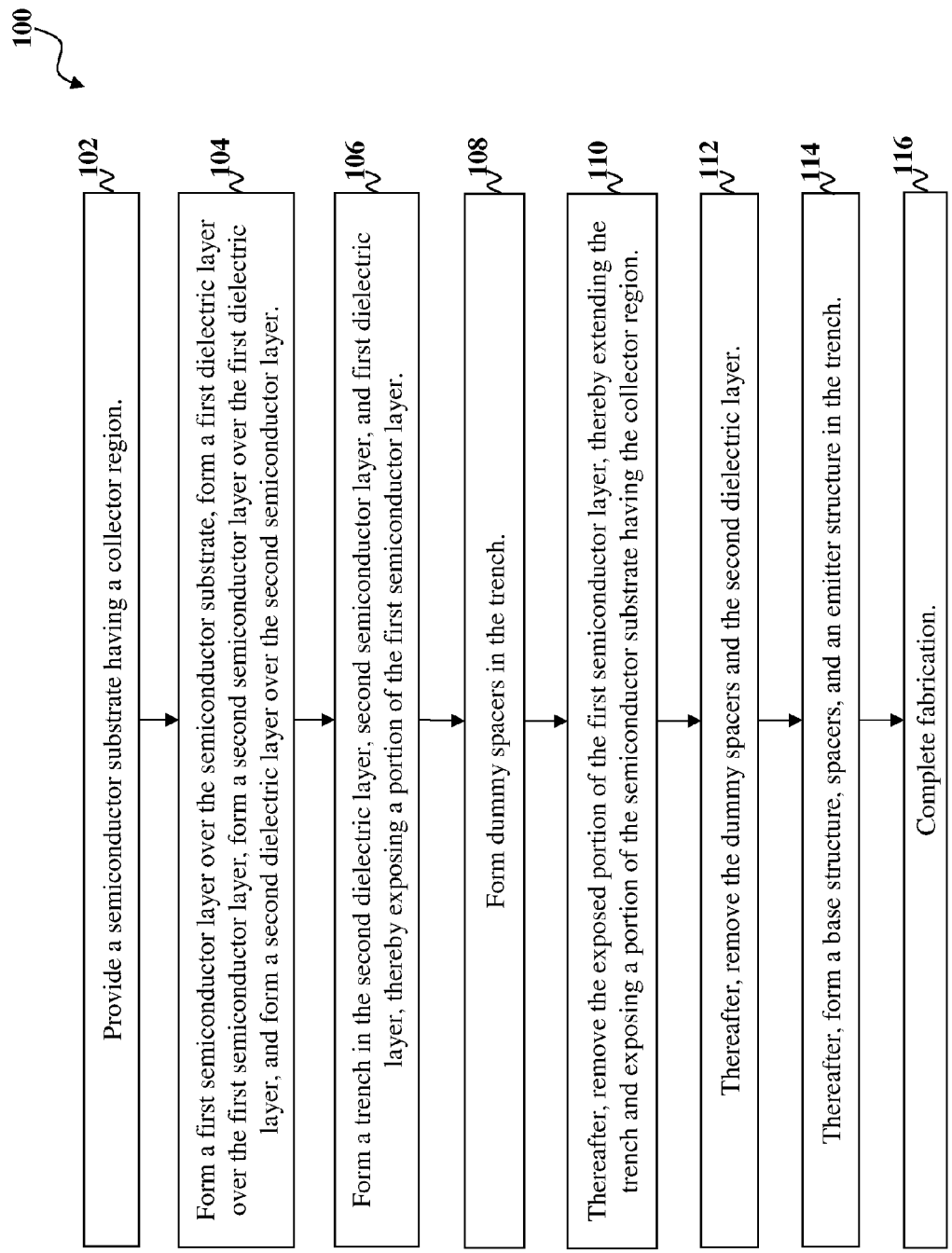
FIG. 1 is a flow chart of a method for fabricating an integrated circuit device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of an embodiment of a method 100 for fabricating an integrated circuit device according to various aspects of the present disclosure. In the depicted embodiment, the method 100 fabricates a bipolar junction transistor. The method 100 begins at block 102 where a semiconductor substrate having a collector region is provided. At block 104, a first semiconductor layer is formed over the semiconductor substrate, a first dielectric layer is formed over the first semiconductor layer, a second semiconductor layer is formed over the first dielectric layer, and a second dielectric layer is formed over the second semiconductor layer. At block 106, a trench is formed in the second dielectric layer, second semiconductor layer, and first dielectric layer, thereby exposing a portion of the first semiconductor layer. The method continues with block 108 where dummy spacers are formed in the trench. Thereafter, at block 110, the exposed portion of the first semiconductor layer is removed, thereby extending the trench and exposing a portion of the semiconductor substrate having the collector region. Thereafter, the method 100 at block 112 includes removing the dummy spacers and second dielectric layer. At block 114, a base structure, spacers, and an emitter structure are then formed in the trench. The method 100 continues with block 116 where fabrication of the integrated circuit device is completed. Additional steps can be provided before, during, and after the method 100, and some of the steps described can be replaced or eliminated for other embodiments of the method. The discussion that follows illustrates various embodiments of an integrated circuit device that can be fabricated according to the method 100 of FIG. 1.

FIGS. 2-11 are various diagrammatic cross-sectional views of an embodiment of an integrated circuit device 200 during various fabrication stages according to the method 100 of FIG. 1. FIGS. 2-11 have been simplified for the sake of clarity to better understand the inventive concepts of the present disclosure. In the depicted embodiment, as will be further discussed below, the integrated circuit device 200 is a bipolar junction transistor (BJT). Additional features can be added in the integrated circuit device 200, and some of the features described below can be replaced or eliminated in other embodiments of the integrated circuit device 200.

Figure 2:
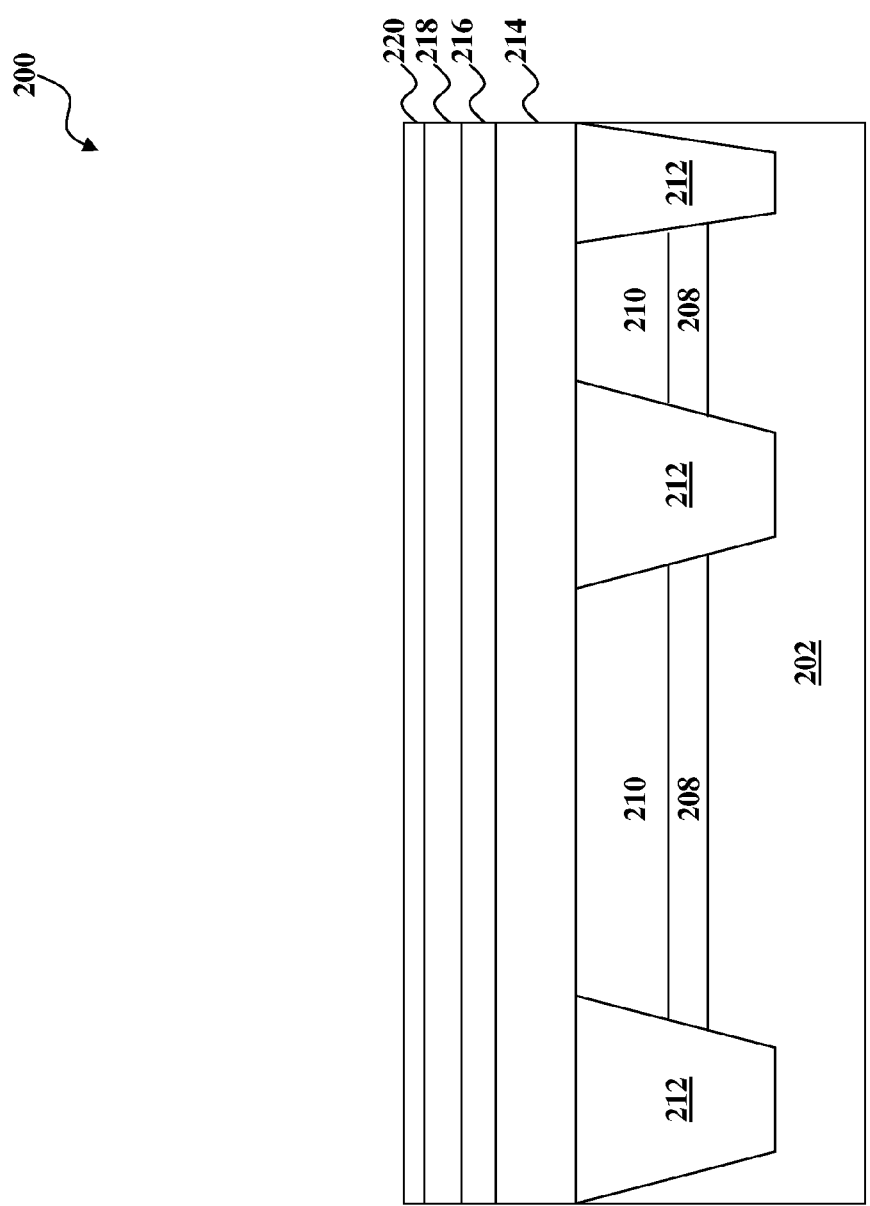
FIGS. 2-11 are various diagrammatic cross-sectional views of an integrated circuit device at various fabrication stages according to the method of FIG. 1.

Referring to FIG. 2, the integrated circuit device 200 includes a substrate 202. In the depicted embodiment, the substrate 202 is a semiconductor substrate including silicon. The substrate may be a p-type or n-type substrate. Alternatively, the substrate 202 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 202 may be a semiconductor on insulator (SOI). The substrate 202 may include a doped epi layer, a gradient semiconductor layer, and/or a semiconductor layer overlying another semiconductor layer of a different type, such as a silicon layer on a silicon germanium layer.

The substrate 202 includes various doped regions depending on design requirements (e.g., p-type wells or n-type wells). In the depicted embodiment, the substrate 202 includes doped regions 208 and 210, which form a collector region of the integrated circuit device 200. The doped regions may be formed directly on the substrate 202, in a P-well structure, in a N-well structure, in a dual-well structure, or using a raised structure. For example, the doped region 208 may be a deeply doped region of the substrate 202, alternatively referred to as a buried layer, such as an n-type buried layer (NBL) or a p-type buried layer (PBL). The doped region 210 may be a lightly doped region of the substrate 202. Alternatively, the doped region 210 may be a doped epi layer, such as a doped Si epi layer. The doped regions 208 and 210 may be doped with p-type dopants, such as boron or $BF_2$; n-type dopants, such as phosphorus or arsenic; or a combination thereof. In the depicted embodiment, the doped regions 208 and 210 are doped with a same dopant type, and the doped regions 208 and 210 include a dopant conductivity type that is different than the dopant conductivity type of the substrate 202.

Isolation features 212 are included in the substrate 202, which isolate various regions of the substrate 202, or isolate the BJT from other devices (not shown) of the integrated circuit device 200. The isolation features 212 utilize isolation technology, such as local oxidation of silicon (LOCOS), shallow trench isolation (STI), and/or deep trench isolation (DTI), to define and electrically isolate the various regions. The isolation features 212 include silicon oxide, silicon nitride, silicon oxynitride, other suitable materials, or combinations thereof. The isolation features 212 are formed by a suitable process. As one example, forming an STI can include a photolithography process, etching a trench in the substrate (for example, by using a dry etching and/or wet etching), and filling the trench (for example, by using a chemical vapor deposition process) with one or more dielectric materials. For example, the filled trench may have a multi-layer structure, such as a thermal oxide liner layer filled with silicon nitride or silicon oxide. In another example, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

A semiconductor layer 214 is disposed over the substrate 202. The semiconductor layer 214 may be referred to as a gate layer. In the depicted embodiment, the semiconductor layer 214 is a polycrystalline silicon (polysilicon) layer. The polysilicon layer may be doped for proper conductivity. Alternatively, the semiconductor layer 214 is an amorphous silicon layer, other suitable semiconductor layer, or combinations thereof. A thickness of the semiconductor layer 214 is about 1,500 Å (angstroms) to about 2,000 Å. In the depicted embodiment, the semiconductor layer 214 has a thickness of about 1,800 Å.

A dielectric layer 216 is disposed over the semiconductor layer 214. The dielectric layer 216 comprises a dielectric material, such as a silicon oxide, silicon oxynitride, silicon nitride, other suitable dielectric material, or combinations thereof. In the depicted embodiment, the dielectric layer 216 is a silicon nitride layer. The dielectric layer 216 has a thickness of about 600 Å to about 1,000 Å. In the depicted embodiment, the dielectric layer 216 has a thickness of about 600 Å.

A semiconductor layer 218 is disposed over the dielectric layer 216. In the depicted embodiment, the semiconductor layer 218 is an amorphous polysilicon layer. The semiconductor layer 218 can provide improved roughness of a later-deposited SiGe layer (such as base layer 230 described below). The material layer 218 has a thickness of about 360 Å to about 1,000 Å. In the depicted embodiment, the semiconductor layer 218 has a thickness of about 800 Å.

A dielectric layer 220 is disposed over the semiconductor layer 218. The dielectric layer 220 comprises a dielectric material, such as a silicon oxide, silicon oxynitride, silicon nitride, other suitable dielectric material, or combinations thereof. In the depicted embodiment, the dielectric layer 220 is a same type of dielectric material as the dielectric layer 216, and thus, the dielectric layer 220 is a silicon nitride layer. Alternatively, the dielectric layer 220 is a different type of dielectric material than the dielectric layer 216. The dielectric layer 220 has a thickness of about 300 Å to about 600 Å. In the depicted embodiment, the dielectric layer 220 has a thickness of about 300 Å.

Figure 3:
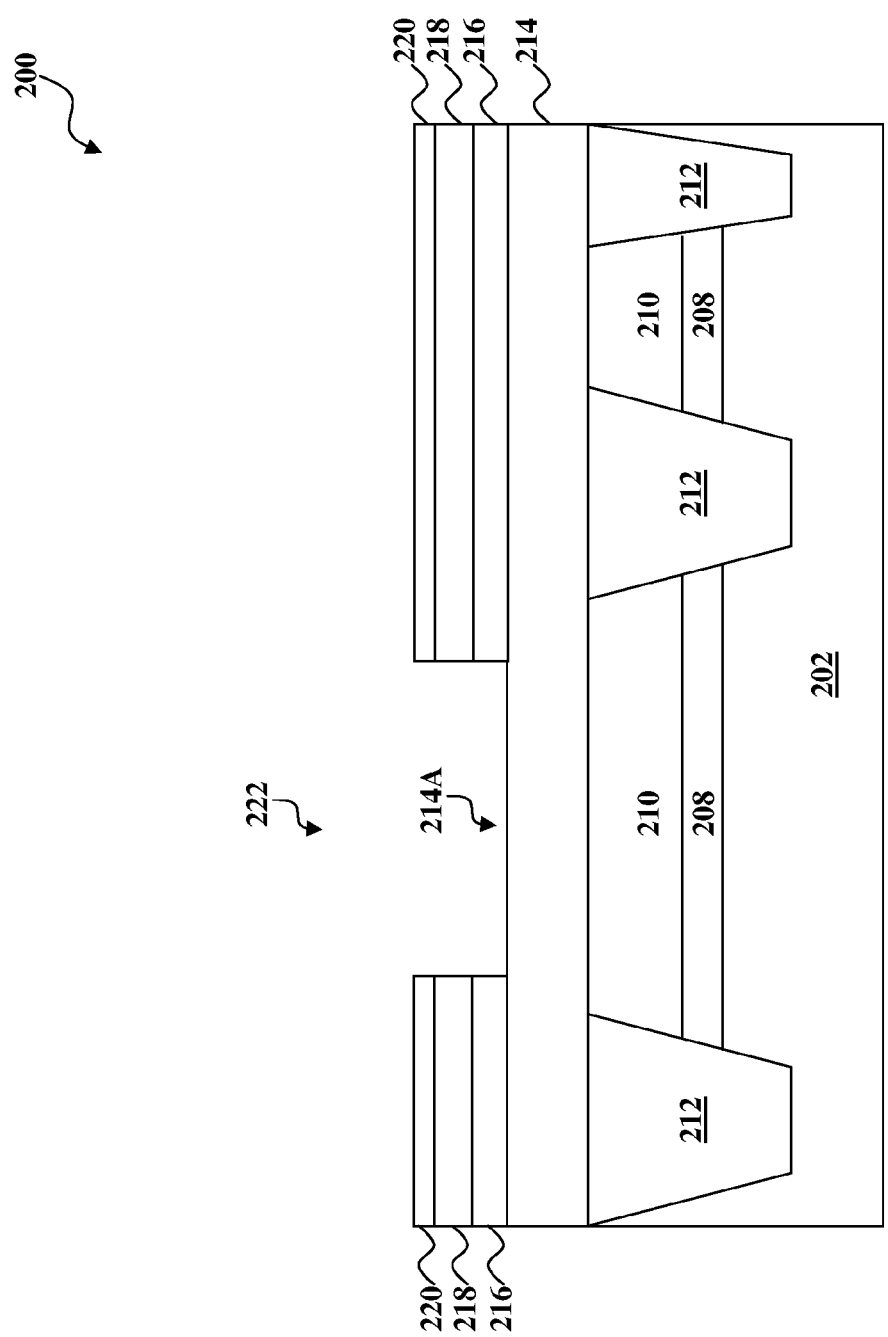

Referring to FIG. 3, portions of the dielectric layer 216, semiconductor layer 218, and dielectric layer 220 are removed, forming an opening (trench) 222. The trench 222 exposes a portion 214A of the gate layer 214. The trench 222 includes a bottom, defined by exposed portion 214A of the gate layer 214, and sidewalls, defined by the dielectric layer 216, semiconductor layer 218, and dielectric layer 220. The trench 222 is formed by a suitable process, such as a lithography and etching process. For example, forming the trench 222 may include forming a resist layer (not shown) over the dielectric layer 220, patterning the resist layer to have an opening substantially similar in width to the opening (trench) 222, and etching the dielectric layer 220, semiconductor layer 218, and dielectric layer 216 within the opening of the resist layer, using the resist layer as a mask. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet another alternative, the lithography process could implement nanoimprint technology. The etching process may be a dry etching process, wet etching process, other suitable etching process, or combinations thereof.

Figure 4:
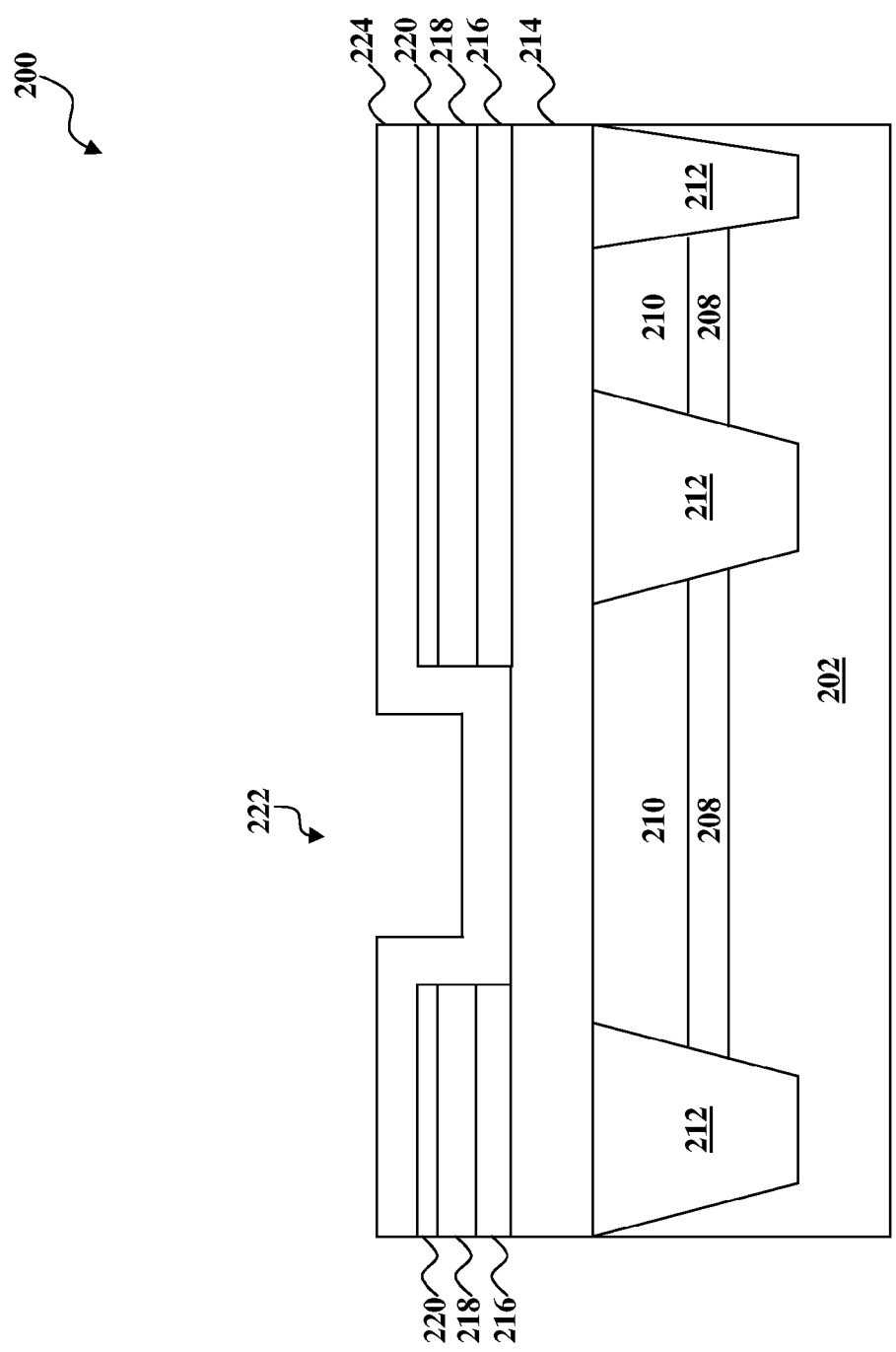
Figure 5:
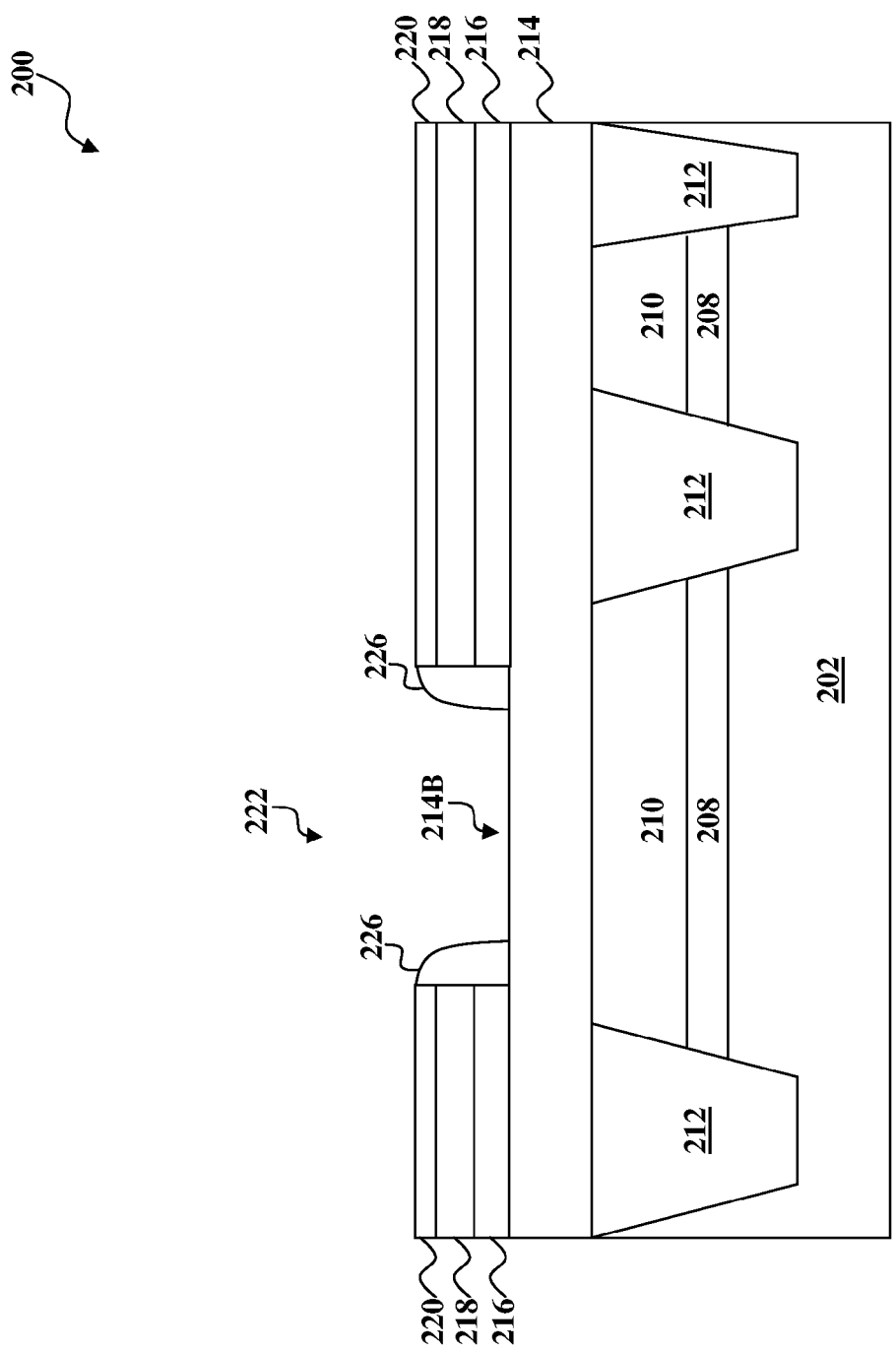

Referring to FIGS. 4 and 5, a dielectric layer 224 is formed over the integrated circuit device 200, and a process is performed on the dielectric layer 224 to form dummy spacers 226 (FIG. 5). More specifically, as illustrated in FIG. 4, the dielectric layer 224 is deposited on the material layer 220 and within the trench 222, thereby partially filling the trench 222 (along a bottom of the trench (i.e., on gate layer 214) and along sidewalls of the trench 222 (i.e., dielectric layer 216, semiconductor layer 218, and dielectric layer 220). The dielectric layer 224 has a thickness of about 1,000 Å to about 1,500 Å. In the depicted embodiment, the dielectric layer 224 has a thickness of about 1,000 Å. The dielectric layer 224 is then etched to form the dummy spacers 226 as illustrated in FIG. 5. For example, the dielectric layer 224 is subjected to a dry etching process to form the dummy spacers 226. The dummy spacers 226 are disposed adjacent to the sidewalls of the trench 222. Alternatively, a wet etching process, or combination dry and wet etching process, could be used to form dummy spacers 226. After the dummy spacers 226 are formed, the dummy spacers 226 define the sidewalls of the trench 222, and the portion 214A of the gate layer 214 exposed by in the trench 222 has been reduced to a portion 214B of the gate layer 214. The dummy spacers 226 will thus protect a portion of the exposed portion 214A of the gate layer 214 in subsequent processing.

Figure 6:
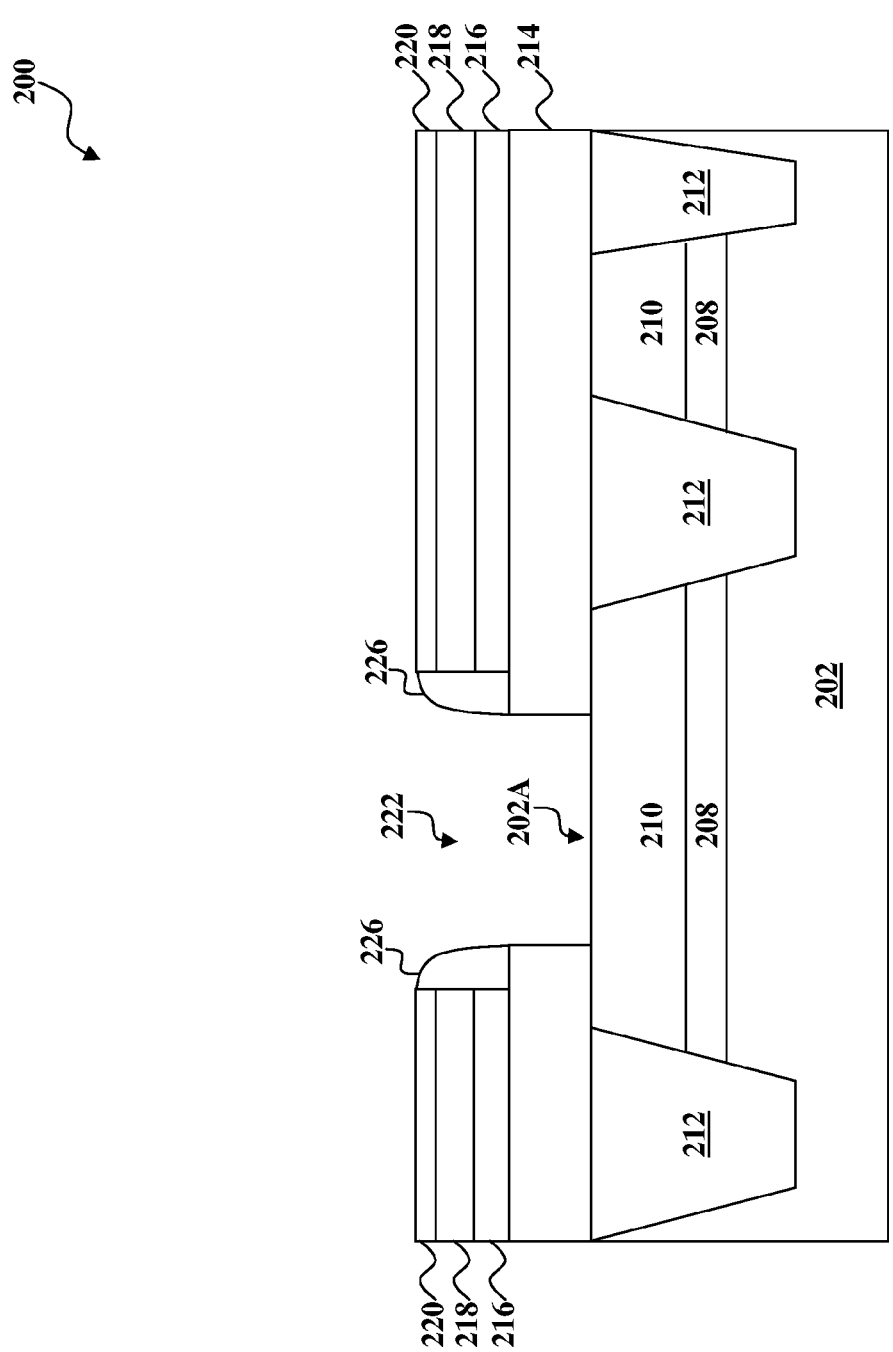
Figure 7:
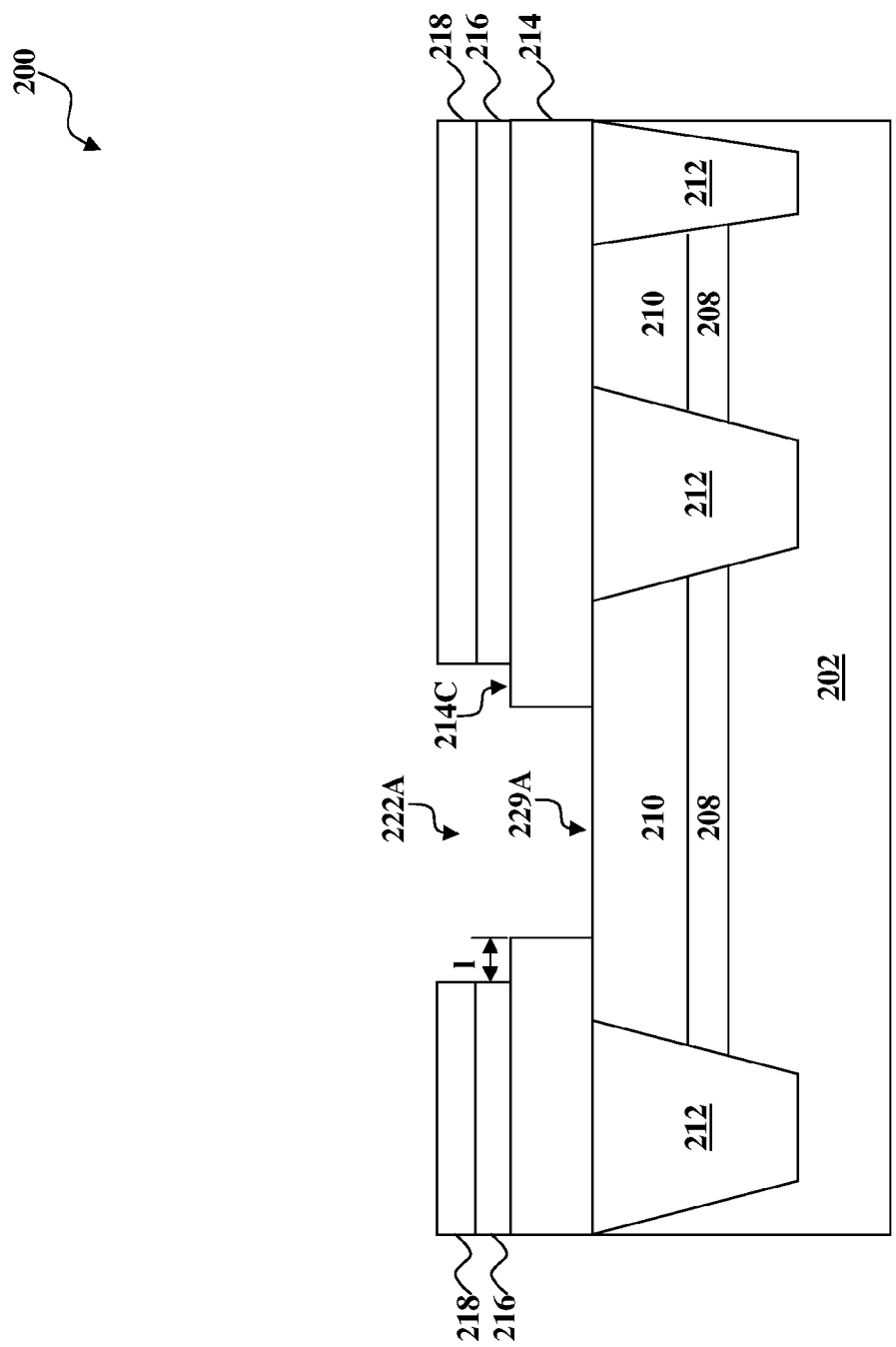

Referring to FIG. 6, the exposed portion 214B of the gate layer 214 is removed by a suitable process, extending the opening (trench) 222 into the gate layer 214. The trench 222 now exposes a portion 202A of the substrate 202, specifically a collector region of the substrate 202. The exposed portion 214B of the gate layer 214 is removed by a dry etching process, wet etching process, other suitable process, or combination thereof. The exposed portion 214B may be removed by a selective etching process that selectively etches the polysilicon gate layer 214, with the dielectric layers 220 and dummy spacers 226 acting as an etching mask. Thereafter, the dummy spacers 226 are removed by a wet etching process as illustrated in FIG. 7. The dielectric layer 220, which is a silicon nitride layer in the depicted embodiment, is simultaneously removed with the dummy spacers 226, exposing portions 214C of the gate layer 214 and resulting in the trench 222A. Alternatively, a wet etching process, combination dry and wet etching process, other suitable process, or combinations thereof, could be used to remove the dummy spacers 226. Referring to FIG. 7, once the dummy spacers 226 are removed, the gate layer 214 extends a distance 1 past the dielectric layer 216 and semiconductor layer 218. The resulting trench 222A defines a base and emitter region of the BJT device 200.

Figure 8:
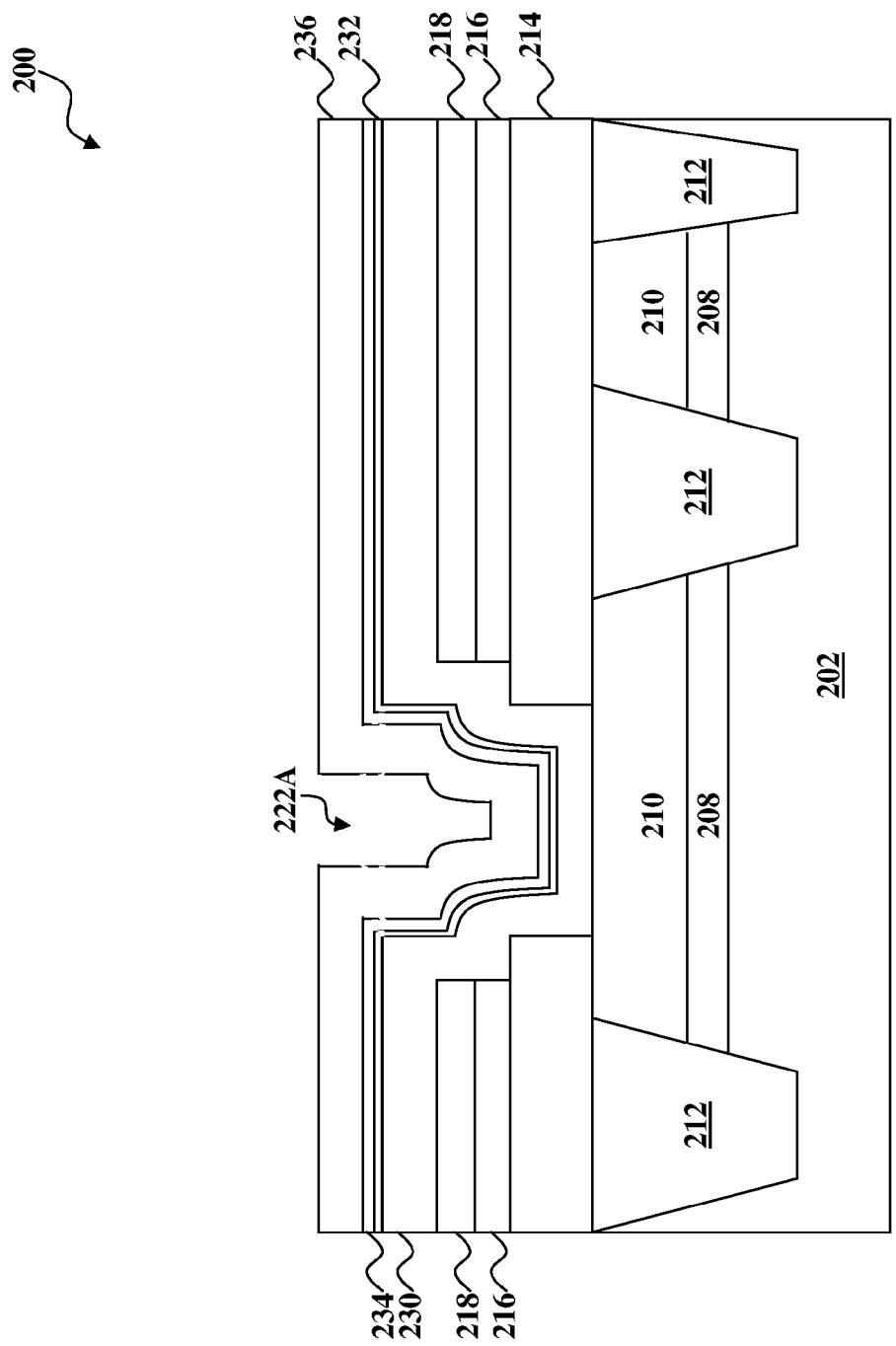

Referring to FIG. 8, a base layer 230 is formed over the substrate 202, specifically over the collector region of the substrate 202. More specifically, the base layer 230 is epitaxially (epi) grown over the semiconductor layer 218 and in the trench 222A. In the depicted embodiment, the base layer 230 is a silicon germanium (SiGe) layer, formed by a silicon germanium epitaxial deposition process. The base layer 230 partially fills the trench 222A. The base layer 230 has a thickness of about 1,000 Å to about 1,500 Å. In the depicted embodiment, the base layer 230 has a thickness of about 1,000 Å. The epitaxy process may use CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors. The base layer 230 may be doped during its deposition (growth) by adding impurities to the source material of the epitaxy process, or subsequent to its deposition growth process by an ion implantation process. For example, alternatively, the base layer 230 could be a silicon epi layer, which may be doped with phosphorous (to form a Si:P epi layer). The doped epitaxial layer may have a gradient doping profile. Alternatively, the base layer 230 is another material suitable for forming the base of the BJT device 200. The thickness of the semiconductor layer 218 can be used to improve uniformity of the base layer 230.

Figure 9:
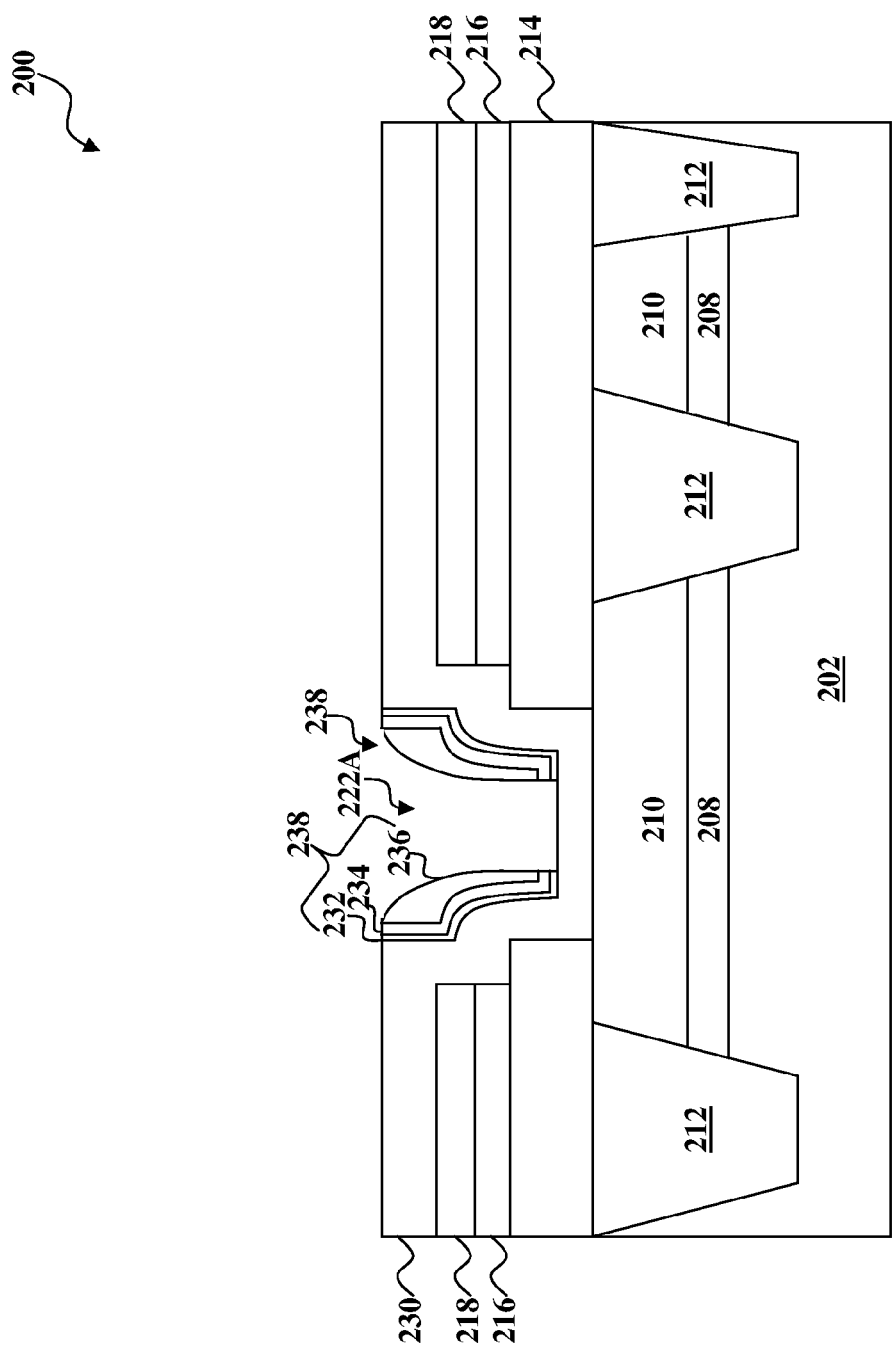

Referring to FIGS. 8 and 9, dielectric layers 232, 234, and 236 are formed over the BJT device 200, and a process is performed on the dielectric layers 232, 234, and 236 to form spacers 238 (FIG. 9). More specifically, as illustrated in FIG. 8, the dielectric layer 232 is deposited over the base layer 230, the dielectric layer 234 is deposited over the dielectric layer 234, and the dielectric layer 236 is deposited over the dielectric layer 234. The dielectric layers 232, 234, and 236 also partially fill the trench 222A. In the depicted embodiment, the spacers 238 are oxide-nitride-oxide (ONO) spacers. Accordingly, dielectric layers 232 and 236 are oxide layers, specifically TEOS-formed oxide layers, and dielectric layer 234 is a silicon nitride layer. The dielectric layers 232, 234, and 236 may alternatively include other combinations of dielectric materials. The dielectric layer 232 has a thickness of about 100 Å to about 200 Å, the dielectric layer 234 has a thickness of about 200 Å to about 400 Å, and the dielectric layer 236 has a thickness of about 1,500 Å to about 2,500 Å. The dielectric layers 232, 234, and 236 are then etched to form the spacers 238 as illustrated in FIG. 9. For example, the dielectric layers 232, 234, and 236 are subjected to a dry etching process to form the spacers 238. Alternatively, a wet etching process, or combination dry and wet etching process, could be used to form spacers 238. After the spacers 238 are formed, the trench 222A is only partially filled and includes a portion having sidewalls defined by the spacers 238 and a bottom defined by the base layer 230 that is not covered by the spacers 238.

Figure 10:
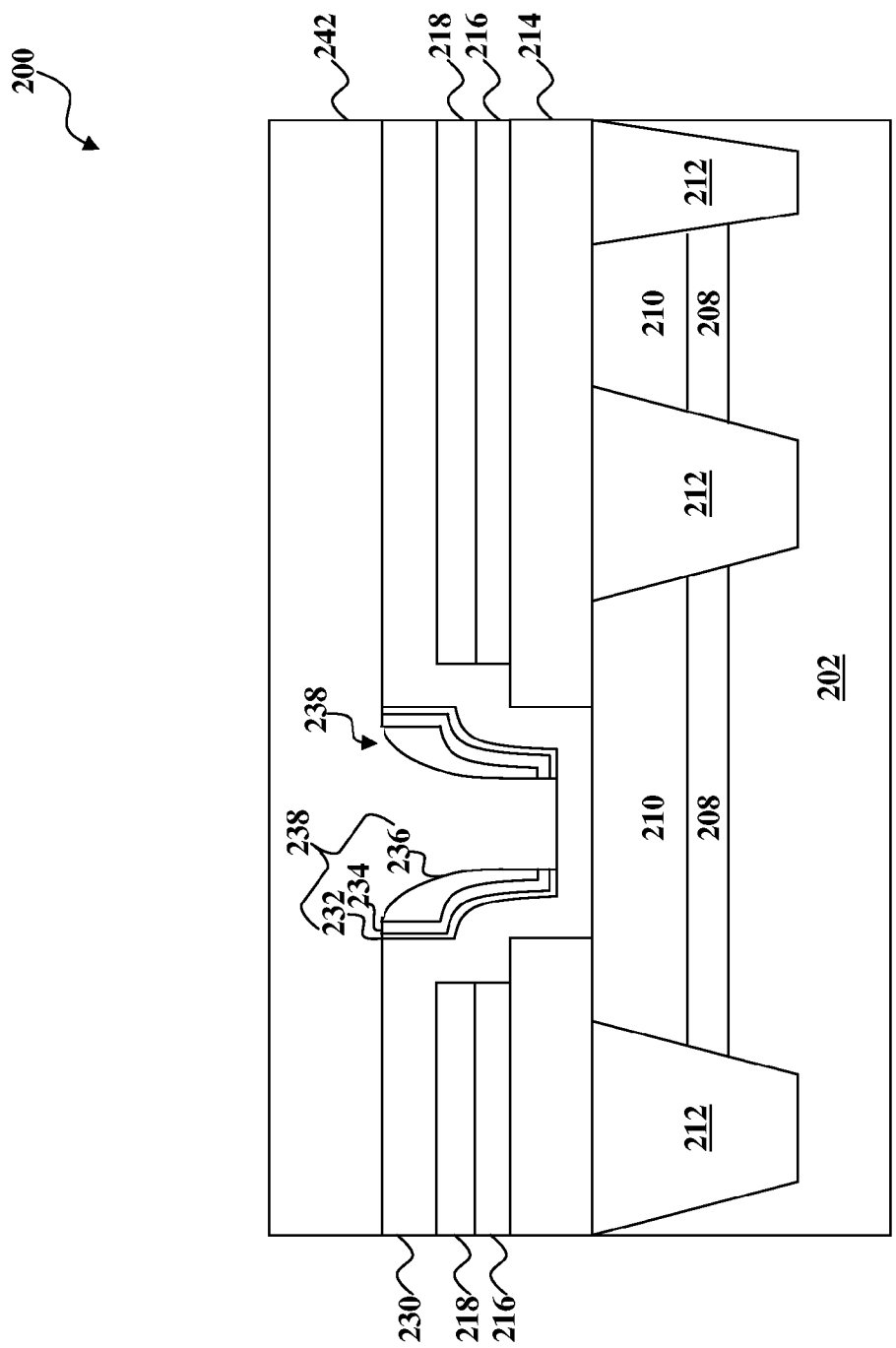
Figure 11:
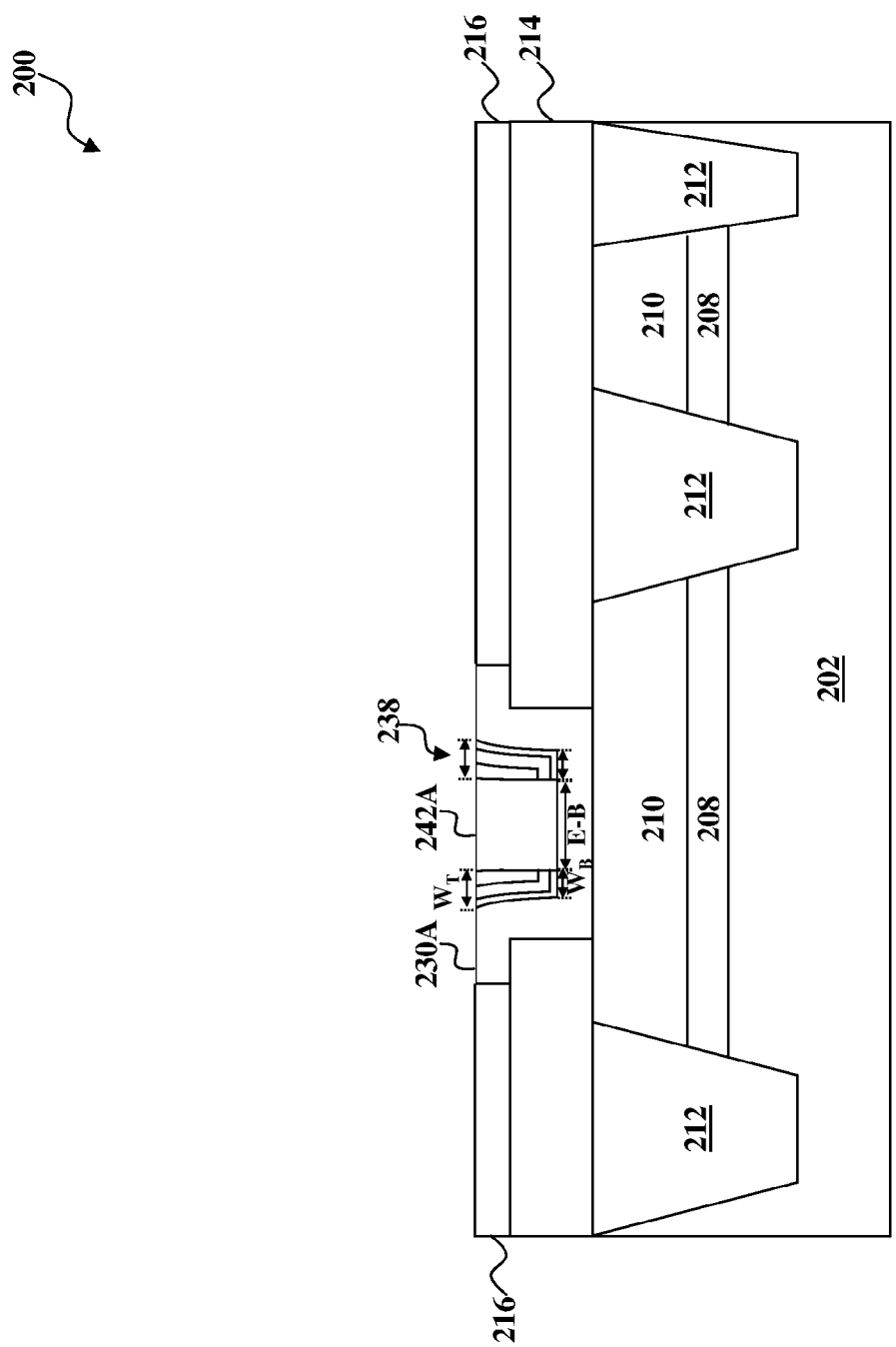

Referring to FIGS. 10 and 11, a base and emitter of the BJT device 200 are formed. In FIG. 10, an emitter layer 242 is formed over the base layer 230 and spacers 238, filling the trench 222A. In the depicted embodiment, the emitter layer 242 is a polysilicon layer. The emitter layer 242 may be doped during formation or after formation, for example, by an ion implantation process. Thereafter, in FIG. 11, a chemical mechanical polishing (CMP) process is performed. The CMP process is performed until the dielectric layer 216 is reached.

The resulting BJT device 200 includes an emitter 242A, a base 230A, and spacers 238 in the emitter-base region that include a top width $W_T$ and a bottom width $W_B$. The top width $W_T$ is about 40 nm to about 60 nm, and the bottom width $W_B$ is about 50 nm to about 70 nm. In the integrated circuit device 200, the bottom width $W_B$ is substantially equal to the top width $W_T$. For example, in the depicted embodiment, the bottom width $W_B$ is about 60 nm and the top width $W_T$ is about 50 nm. Alternatively, the bottom width $W_B$ is substantially equal to the top width $W_T$ when a ratio between the top width $W_T$ and the bottom width $W_B$ is about 1:1.5 or less. The substantially equal top and bottom width of the spacers 238 enlarges the emitter-to-base, E-B, contact area between the emitter 242A and base 230A, and also enlarges a top area of the emitter 242A, allowing larger area for landing a contact to the emitter 242A.

Conventional BJT devices include spacers having a substantially tapered profile, where a top width of the spacers is substantially smaller than a bottom width. With the substantially tapered profile, often, (1) the top width of the spacers is too small, leading to bridging problems between top portions of the emitter and base, and/or (2) the bottom width of the spacers is too large, leading to increased resistance between bottom portions of the emitter and base, thus leading to decreased device performance. In contrast, the disclosed BJT device 200 includes spacers 238 with substantially equivalent bottom and top widths, where the spacers 238 exhibit substantially non-tapered profiles (for example, a substantially rectangular or square shape). The disclosed BJT device 200 exhibits reduced resistance and improved isolation. More specifically, the increased top width of the spacers 238 enhances isolation between top portions of the emitter 242A and base 230A, and the decreased bottom width decreases resistance between bottom portions of the emitter 242A and base 230A. For example, the reduced bottom width of the spacers 238 has been observed to reduce total base resistance (resistance of base 230A) by 10%-15% when compared with conventional BJT devices with substantially tapered spacers. Further, the disclosed method 100, which can be used to fabricate the BJT device 200, is easily and cost-effectively implemented into current fabrication processes. For example, the method 100 does not require an extra mask. The method 100 can be easily implemented into current BJT processing by tuning the various etching recipes and a few extra deposition processes.

The BJT device 200 may include additional features, which may be formed by subsequent processing. For example, contacts to the base 230A, emitter 242A, and collector region of the substrate 202 may be formed. Various contacts/vias/lines and multilayer interconnect features (e.g., metal layers and interlayer dielectrics) may be formed over the substrate 202, configured to connect the various features or structures of the BJT device 200. The additional features may provide electrical interconnection to the device 200. For example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Figure 12:
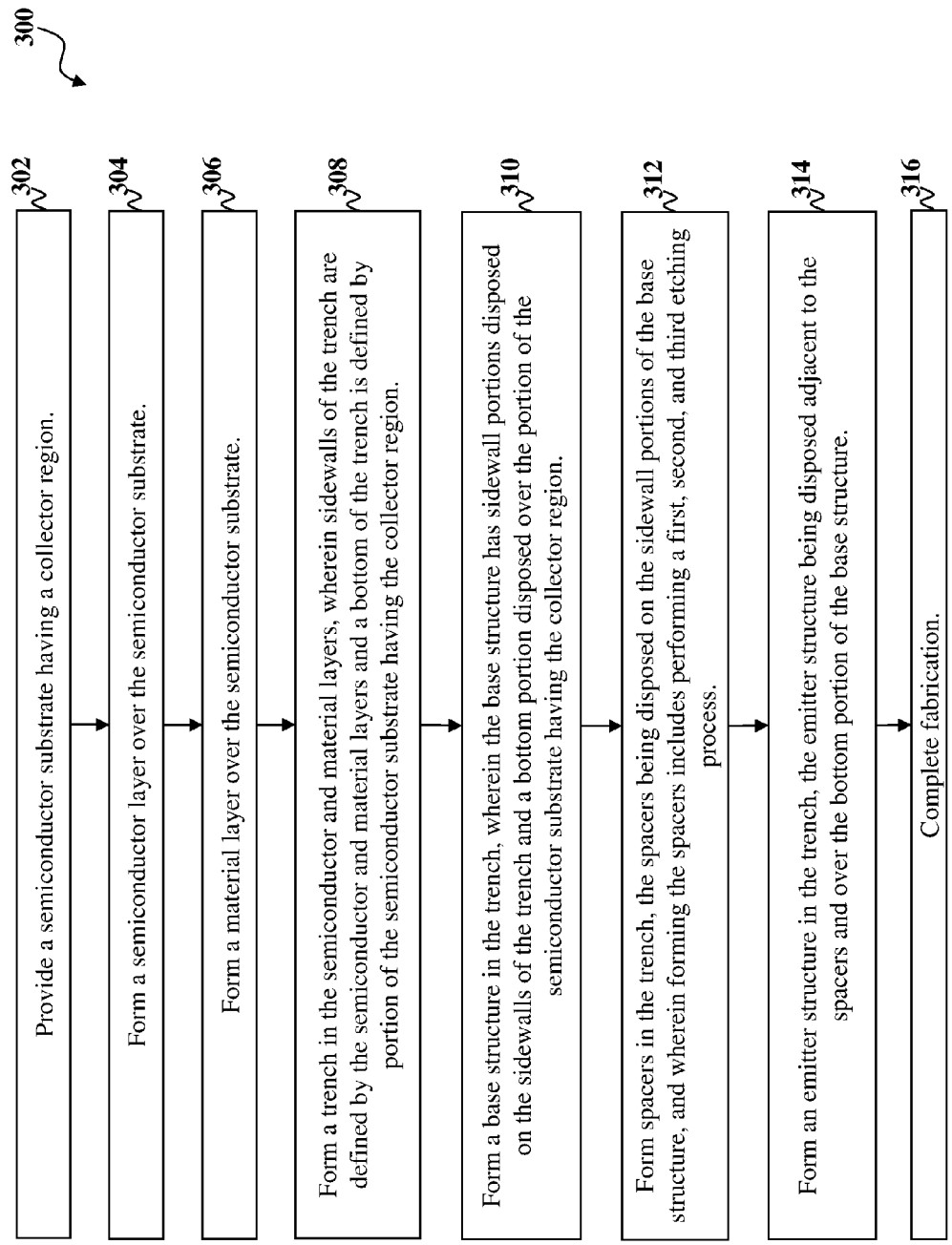
FIG. 12 is a flow chart of another method for fabricating an integrated circuit device according to various aspects of the present disclosure.

FIG. 12 is a flow chart of an embodiment of a method 300 for fabricating an integrated circuit device according to various aspects of the present disclosure. In the depicted embodiment, the method 300 fabricates a bipolar junction transistor. The method 300 begins at block 302 where a semiconductor substrate having a collector region is provided. At block 304, a semiconductor layer is formed over the semiconductor substrate. At block 306, a material layer is formed over the semiconductor layer. The method continues with block 308 where a trench is formed in the semiconductor and material layers. The trench includes sidewalls defined by the semiconductor and material layers and a bottom defined by a portion of the semiconductor substrate having the collector region. At block 310, a base structure is formed in the trench. The base structure has sidewall portions disposed on sidewalls of the trench and a bottom portion disposed over the portion of the semiconductor substrate having the collector region. The method 100 at block 312 includes forming spacers in the trench, the spacers being disposed on the sidewall portions of the base structure. Forming the spacers includes performing a first, second, and third etching process. At block 314, an emitter structure is formed in the trench. The emitter structure is disposed adjacent to the spacers and over the bottom portion of the base structure. The method 300 continues with block 316 where fabrication of the integrated circuit device is completed. Additional steps can be provided before, during, and after the method 300, and some of the steps described can be replaced or eliminated for other embodiments of the method. The discussion that follows illustrates various embodiments of an integrated circuit device that can be fabricated according to the method 300 of FIG. 12.

FIGS. 13-20 are various diagrammatic cross-sectional views of an embodiment of an integrated circuit device 400 during various fabrication stages according to the method 300 of FIG. 12. FIGS. 13-20 have been simplified for the sake of clarity to better understand the inventive concepts of the present disclosure. In the depicted embodiment, as will be further discussed below, the integrated circuit device 400 is a bipolar junction transistor (BJT). Additional features can be added in the integrated circuit device 400, and some of the features described below can be replaced or eliminated in other embodiments of the integrated circuit device 400.

Figure 13:
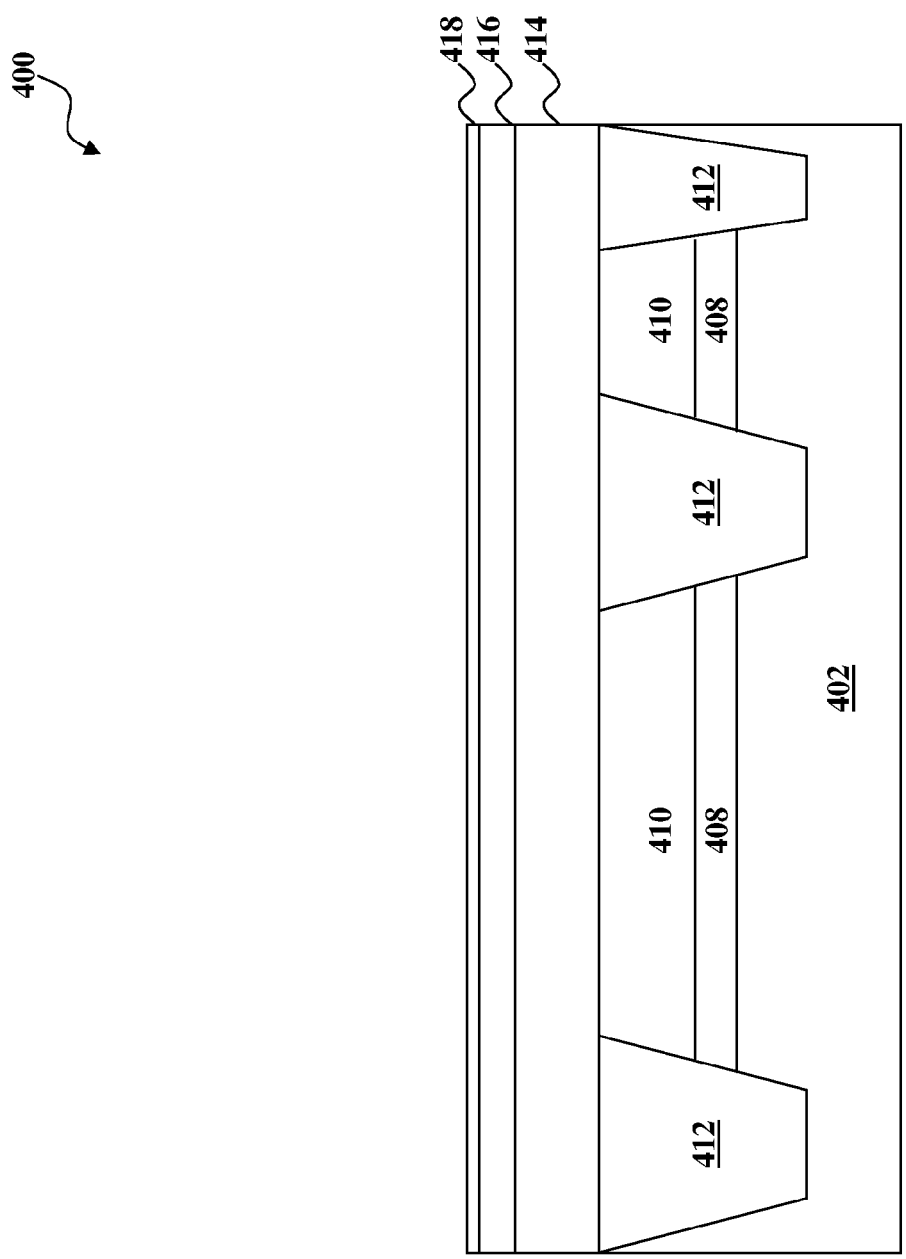
FIGS. 13-20 are various diagrammatic cross-sectional views of an integrated circuit device at various fabrication stages according to the method of FIG. 12.

Referring to FIG. 13, the integrated circuit device includes a substrate 402. In the depicted embodiment, the substrate 402 is a semiconductor substrate including silicon. The substrate may be a p-type or n-type substrate. Alternatively, the substrate 402 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 402 may be a semiconductor on insulator (SOI). The substrate 402 may include a doped epi layer, a gradient semiconductor layer, and/or a semiconductor layer overlying another semiconductor layer of a different type, such as a silicon layer on a silicon germanium layer. The substrate 402 includes various doped regions (not shown) depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly on the substrate 402, in a P-well structure, in a N-well structure, in a dual-well structure, or using a raised structure.

The substrate 402 includes various doped regions depending on design requirements (e.g., p-type wells or n-type wells). In the depicted embodiment, the substrate 402 includes doped regions 408 and 410, which form a collector region of the integrated circuit device 400. The doped regions may be formed directly on the substrate 402, in a P-well structure, in a N-well structure, in a dual-well structure, or using a raised structure. For example, the doped region 408 may be a deeply doped region of the substrate 402, alternatively referred to as a buried layer, such as an n-type buried layer (NBL) or a p-type buried layer (PBL). The doped region 410 may be a lightly doped region of the substrate 402. Alternatively, the doped region 410 may be a doped epi layer, such as a doped Si epi layer. The doped regions 408 and 410 may be doped with p-type dopants, such as boron or $BF_2$; n-type dopants, such as phosphorus or arsenic; or a combination thereof. In the depicted embodiment, the doped regions 408 and 410 are doped with a same dopant type, and the doped regions 408 and 410 include a dopant conductivity type that is different than the dopant conductivity type of the substrate 402.

Isolation features 412 are included in the substrate 402, which isolate various regions of the substrate 402, or isolate the BJT from other devices (not shown) of the integrated circuit device 400. The isolation features 412 utilize isolation technology, such as local oxidation of silicon (LOCOS), shallow trench isolation (STI), and/or deep trench isolation (DTI), to define and electrically isolate the various regions. The isolation features 412 include silicon oxide, silicon nitride, silicon oxynitride, other suitable materials, or combinations thereof. The isolation features 412 are formed by a suitable process. As one example, forming an STI can include a photolithography process, etching a trench in the substrate (for example, by using a dry etching and/or wet etching), and filling the trench (for example, by using a chemical vapor deposition process) with one or more dielectric materials. For example, the filled trench may have a multi-layer structure, such as a thermal oxide liner layer filled with silicon nitride or silicon oxide. In another example, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

A semiconductor layer 414 is disposed over the substrate 402. The semiconductor layer 414 may be referred to as a gate layer. In the depicted embodiment, the semiconductor layer 414 is a polycrystalline silicon (polysilicon) layer. The polysilicon layer may be doped for proper conductivity. Alternatively or additionally, the semiconductor layer 414 is an amorphous silicon layer, other suitable semiconductor layer, or combinations thereof. A thickness of the semiconductor layer 414 is about 1,500 Å to about 2,000 Å. In the depicted embodiment, the semiconductor layer 414 has a thickness of about 1,800 Å.

A dielectric layer 416 is disposed over the semiconductor layer 414. The dielectric layer 416 comprises a dielectric material, such as silicon oxide, silicon oxynitride, silicon nitride, other suitable dielectric material, or combinations thereof. In the depicted embodiment, the dielectric layer 416 is a silicon nitride layer. The dielectric layer 416 has a thickness of about 600 Å to about 1,000 Å. In the depicted embodiment, the dielectric layer 416 has a thickness of about 600 Å.

A semiconductor layer 418 is disposed over the material layer 416. In the depicted embodiment, the semiconductor layer 418 is an amorphous polysilicon layer. The material layer 218 has a thickness of about 360 Å to about 1,000 Å. In the depicted embodiment, the semiconductor layer 218 has a thickness of about 800 Å.

Referring to FIG. 13, portions of the semiconductor layer 418, dielectric layer 416, and semiconductor (gate) layer 414 are removed, forming an opening (trench) 420. The trench 420 defines a base and emitter region of the bipolar junction transistor 400. The trench 420 exposes a portion 421 of the substrate 402. The trench 420 is formed by a suitable process, such as a lithography and etching process. For example, forming the trench 420 may include forming a resist layer (not shown) over the semiconductor layer 418, patterning the resist layer to have an opening substantially similar in width to the opening (trench) 420, and etching the semiconductor layer 418, dielectric layer 416, and semiconductor (gate) layer 414 within the opening of the resist layer, using the resist layer as a mask. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet another alternative, the lithography process could implement nanoimprint technology. The etching process may be a dry etching process, wet etching process, other suitable etching process, or combinations thereof.

Figure 14:
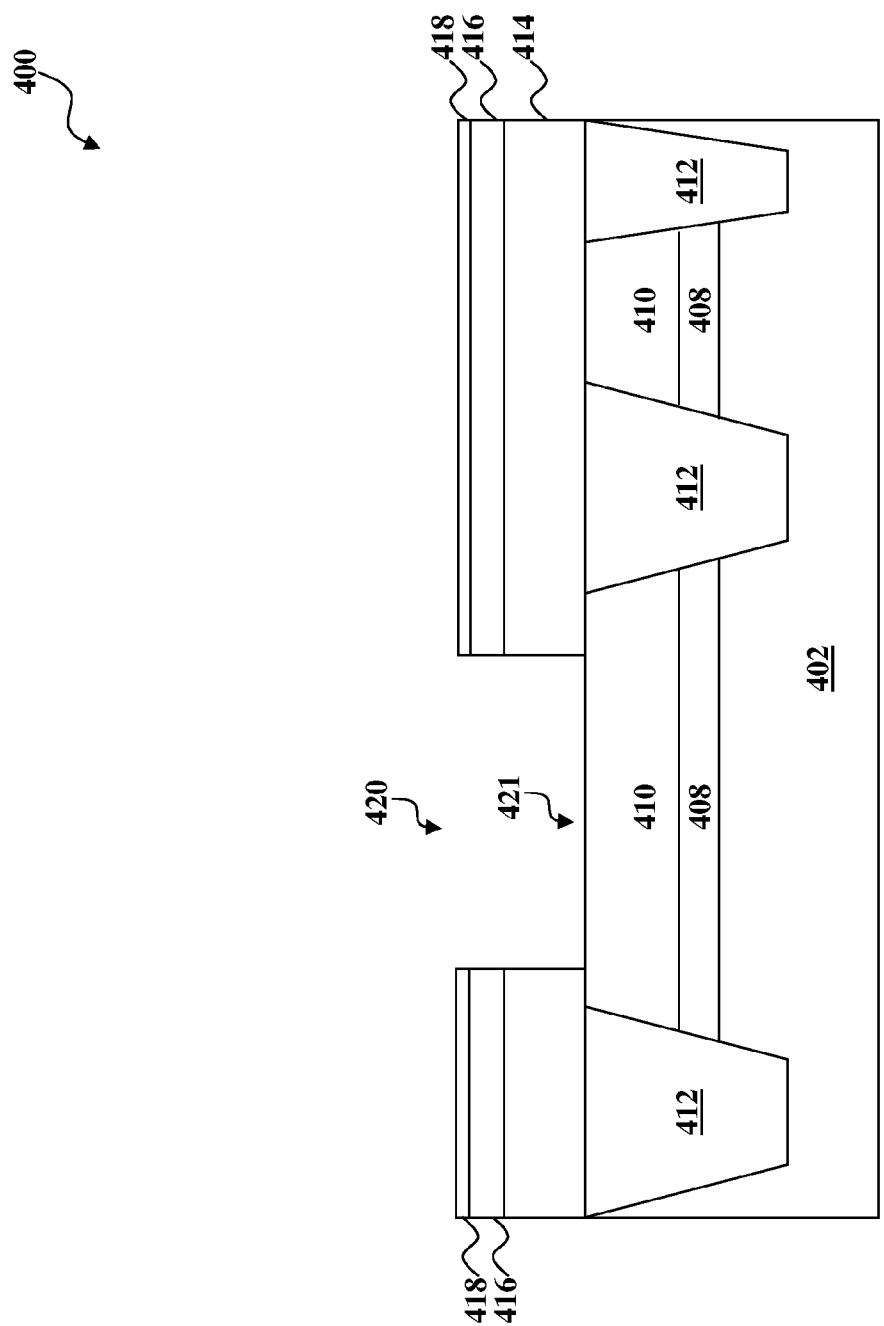
Figure 15:
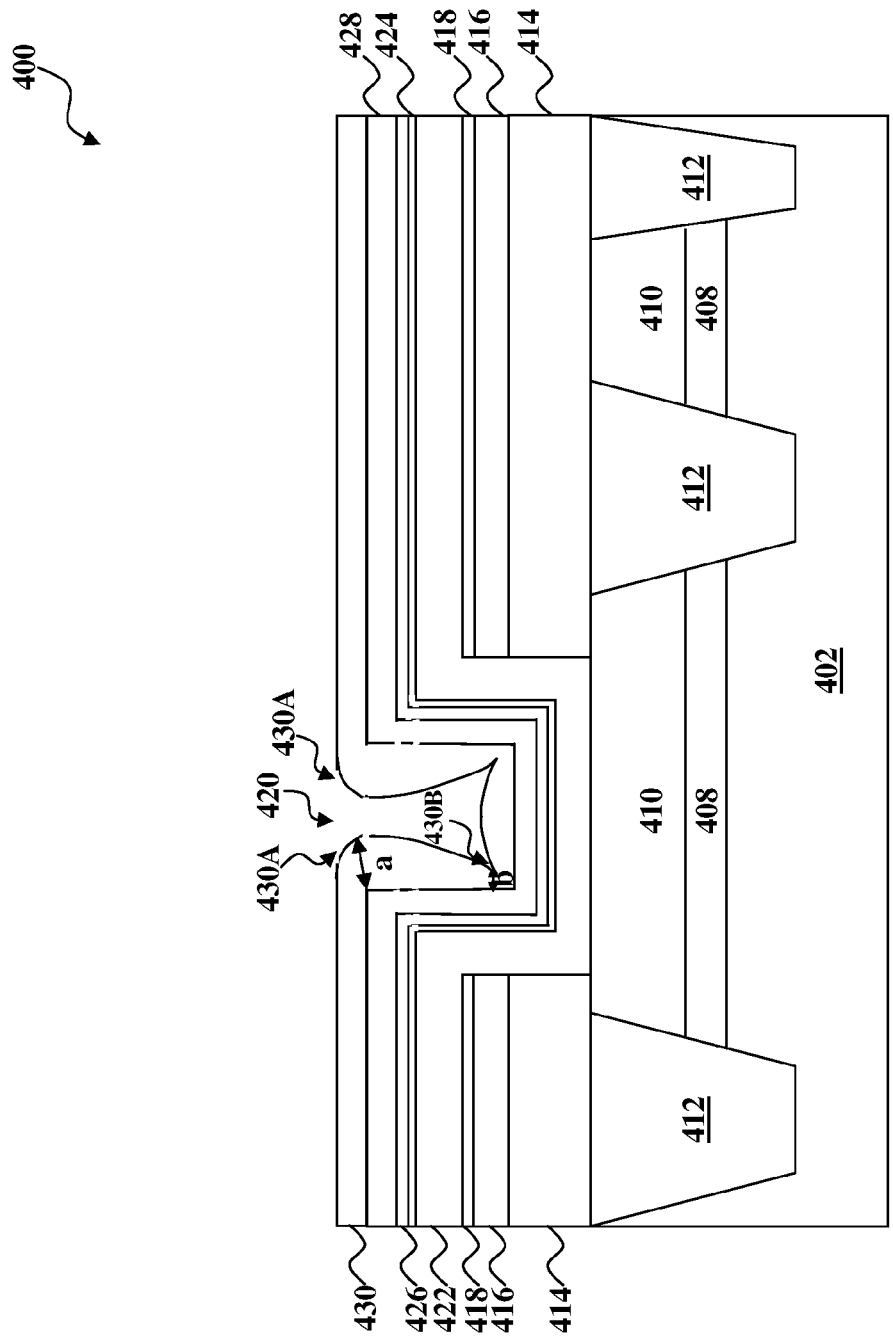

Referring to FIG. 14, a base layer 422 is formed over the substrate 402. In the depicted embodiment, the base layer 422 is a silicon germanium (SiGe) layer formed over the semiconductor layer 418 and in the trench 420 by a selective epitaxial growth (SEG) process. The base layer 422 partially fills the trench 420. The base layer 422 has a thickness of about 1,000 Å to about 1,500 Å. In the depicted embodiment, the base layer 422 has a thickness of about 1,000 Å. The epitaxy process may use CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors. The base layer 422 may be doped during its deposition (growth) by adding impurities to the source material of the epitaxy process, or subsequent to its deposition growth process by an ion implantation process. For example, alternatively, the base layer 422 could be a silicon epi layer, which may be doped with phosphorous (to form a Si:P epi layer). The doped epitaxial layer may have a gradient doping profile. Alternatively, the base layer 230 is another material suitable for forming the base of the BJT device 400.

Figure 16:
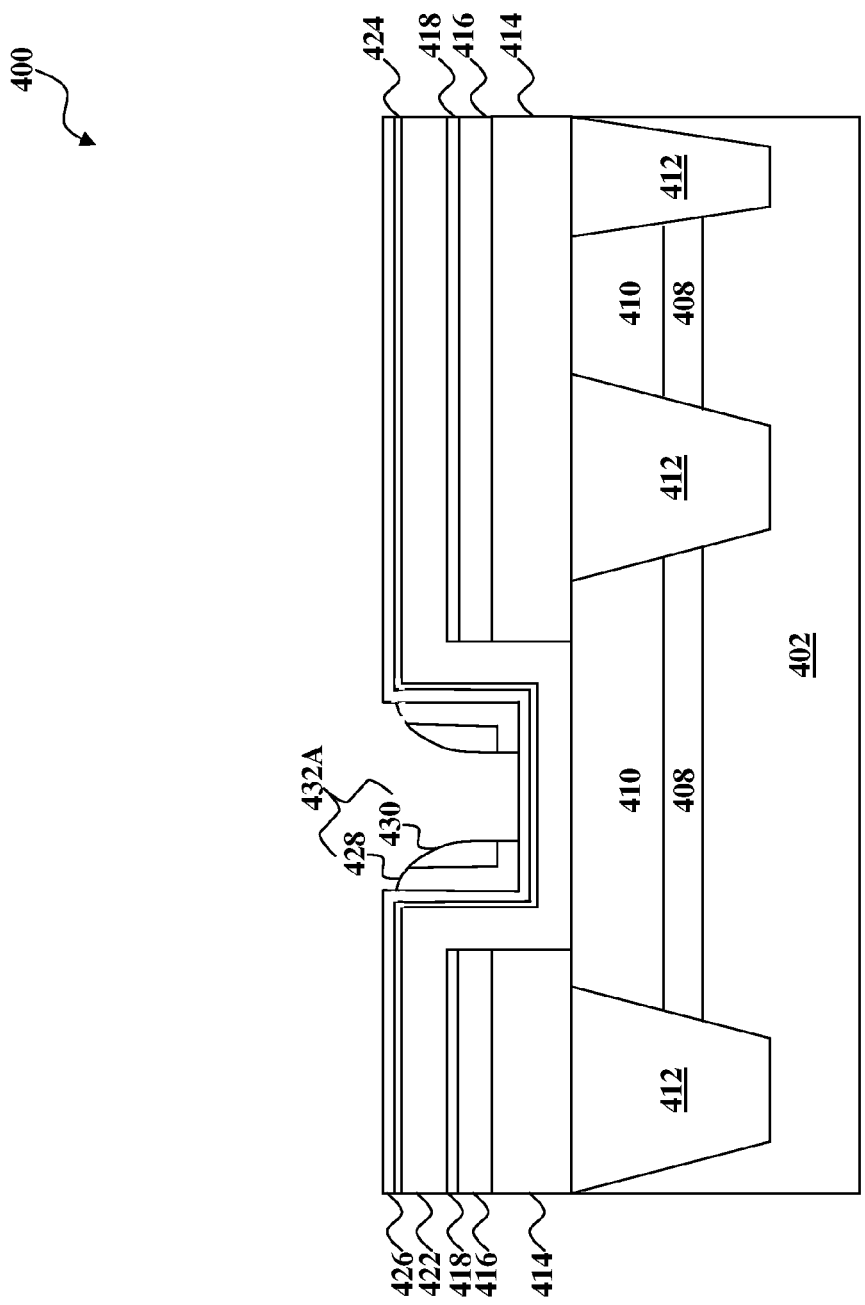
Figure 17:
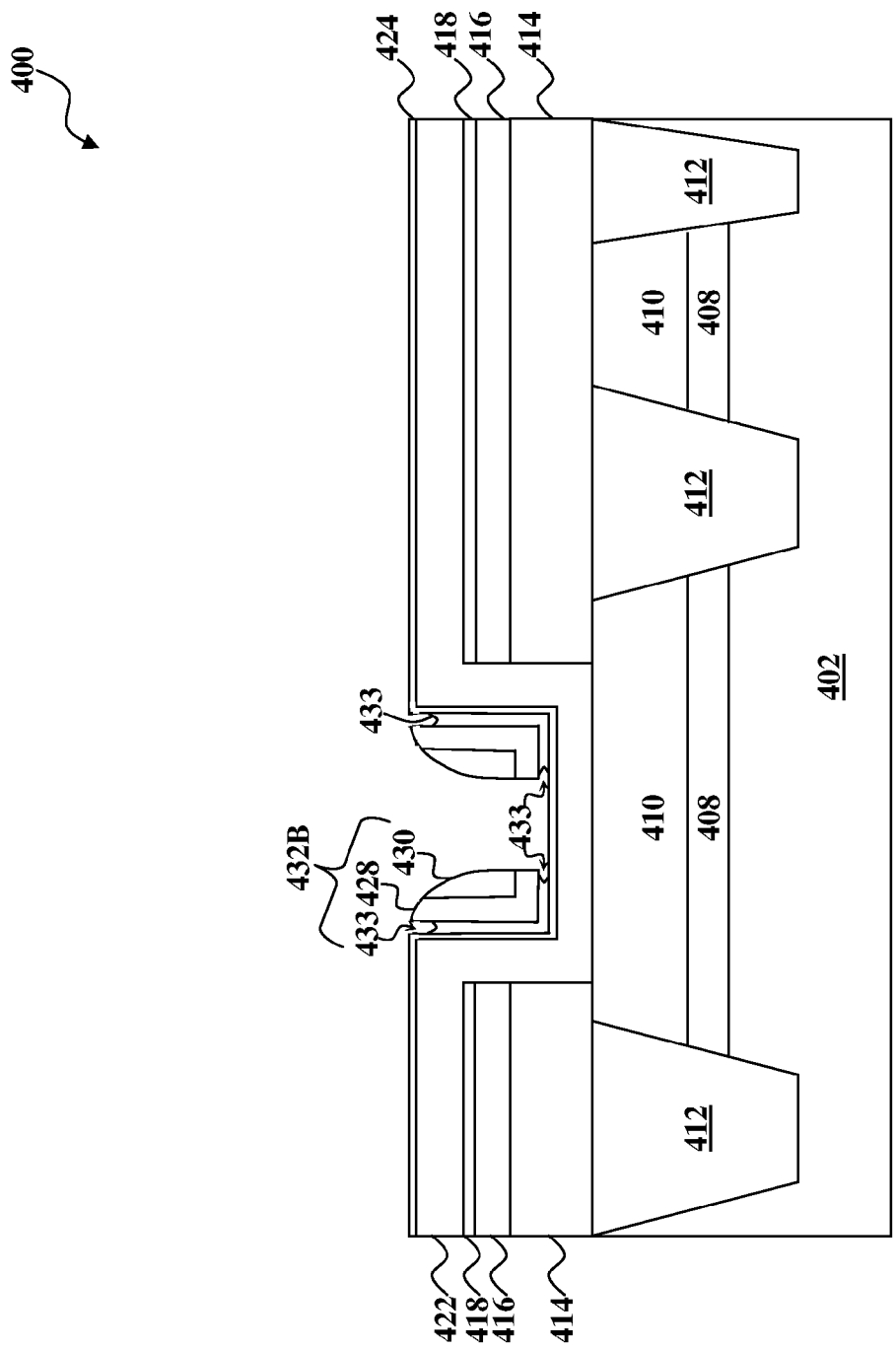

Referring to FIGS. 15-18, dielectric layers 424, 426, 428, and 430 are formed over the BJT device 400, and a process is performed on the dielectric layers 424, 426, 428, and 430 to form spacers 434 (FIG. 17). In the depicted embodiment, referring to FIG. 15, the dielectric layers 424, 426, 428, and 430 are deposited over the base layer 422 and within the trench 420, thereby partially filling the trench 420. The dielectric layers 424, 426, 428, and 430 comprise a dielectric material, such as silicon oxide, silicon oxynitride, silicon nitride, other suitable dielectric material, or combinations thereof. In the depicted embodiment, the dielectric layers 424 and 428 are formed using a chemical vapor deposition (CVD) process. The CVD process uses a tetra-ethyl-ortho-silicate (TEOS) precursor, and thus, the dielectric layers 424 are TEOS formed oxide layers. The dielectric layer 426 is a silicon nitride layer, which may be formed by a CVD process. The dielectric layer 430 is formed using a plasma enhanced CVD process, and thus, the dielectric layer 430 is a plasma enhanced oxide (PE oxide) layer. The dielectric layer 424 has a thickness of about 100 Å to about 200 Å, the dielectric layer 426 has a thickness of about 200 Å to about 400 Å, the dielectric layer 428 has a thickness of about 800 Å to about 1,200 Å, and the dielectric layer 430 has a thickness of about 800 Å to about 1,200 Å. In the depicted embodiment, dielectric layer 424 has a thickness of about 100 Å, the dielectric layer 426 has a thickness of about 300 Å, the dielectric layer 428 has a thickness of about 1,000 Å, and the dielectric layer 430 has a thickness of about 1,000 Å. Within the trench 420, the dielectric layer has a portion 430A that hangs over another portion 430B, and thus, the portions 430A may be referred to as hang-over portions. The hang-over portions 430A have a thickness a, and the portions 430B have a thickness b. In the depicted embodiment, a ratio of a to b (a/b) is greater than or equal to about 1.37. As will be discussed further below, the hang-over structure provided by the depicted embodiment contributes to an increase in a top width $W_T$ of the spacers 434.

Referring to FIG. 16, the dielectric layers 430 and 428 are first etched to form spacers 432A. For example, portions of the dielectric layers 430 and 428 are removed by a dry etching process to form the spacers 432A, leaving the dielectric layer 426 exposed. The dielectric layer 426 (silicon nitride layer) can act as an etch stop layer when the dielectric layers 430 and 428 (TEOS formed oxide layer and PE oxide layer) are etched. Thereafter, referring to FIG. 17, the dielectric layer 426 is etched to form spacers 432B. For example, portions of the dielectric layer 426 are removed by a wet etching process to form the spacers 432B, leaving the dielectric layer 424 exposed. In the depicted embodiment, the wet etching process utilizes an $H_3PO_4$ etching solution. Typically, a dry etching process is used to etch the dielectric layer 426. In contrast, in the depicted embodiment, the wet etching process laterally etches portions of the dielectric layer 426, forming notches 433 in the spacers 432B. As will be discussed further below, the notches 433 decrease a width of a bottom portion of the spacers 432B, which can reduce resistance of the BJT device 400. Alternatively, other etching solutions may be implemented to etch the dielectric layer 426.

Figure 18:
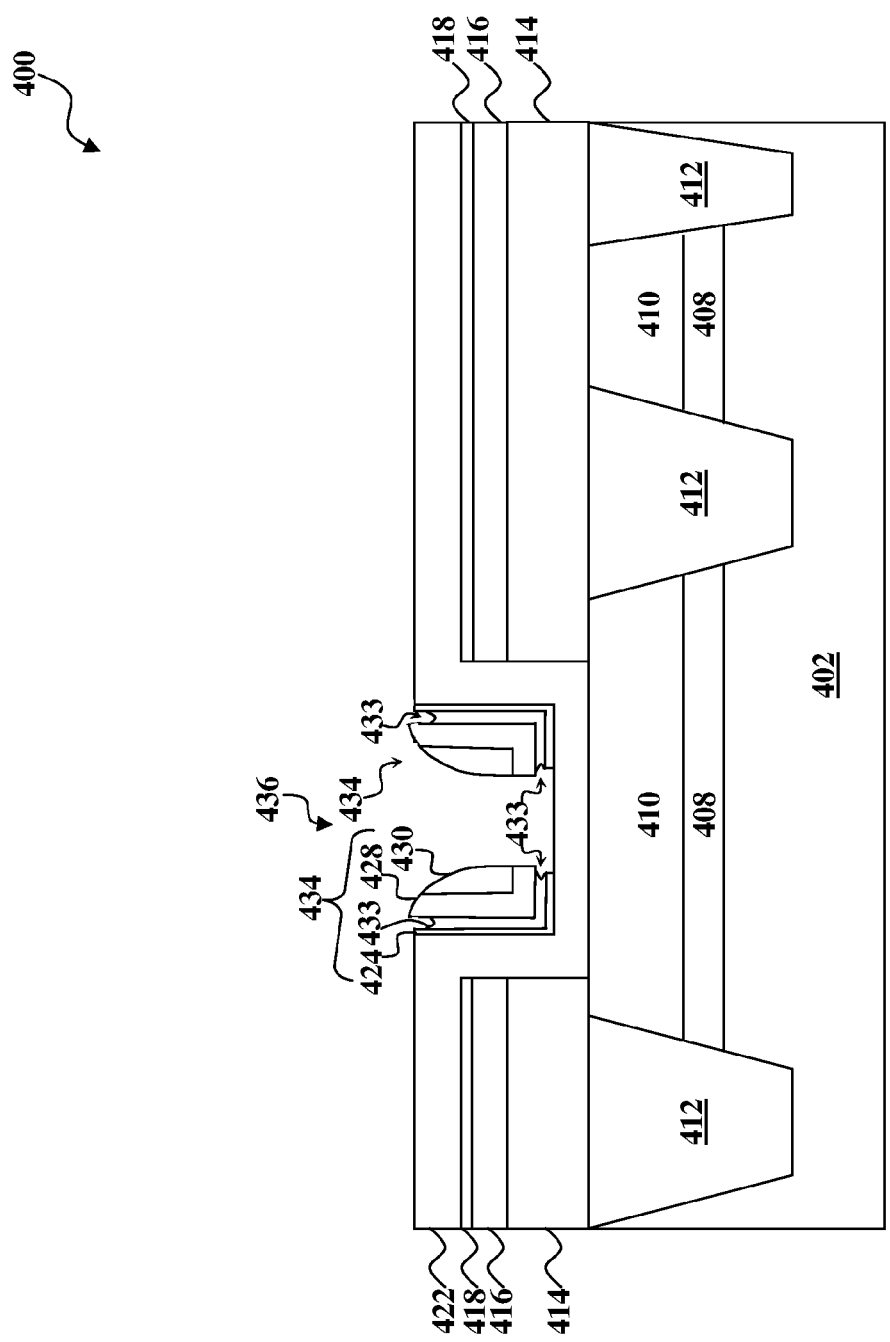

Referring to FIG. 18, the dielectric layer 424 is etched to form spacers 434. For example, portions of the dielectric layer 424 are removed by a wet etching process to form the spacers 434, leaving the base layer 422 exposed. In the depicted embodiment, the wet etching process utilizes an hydrofluoric acid (HF) etching solution. Alternatively, other etching solutions may be implemented to etch the dielectric layer 424. After the spacers 434 are formed in the base and emitter region, a trench 436 defines the emitter region of the BJT device 400.

Figure 19:
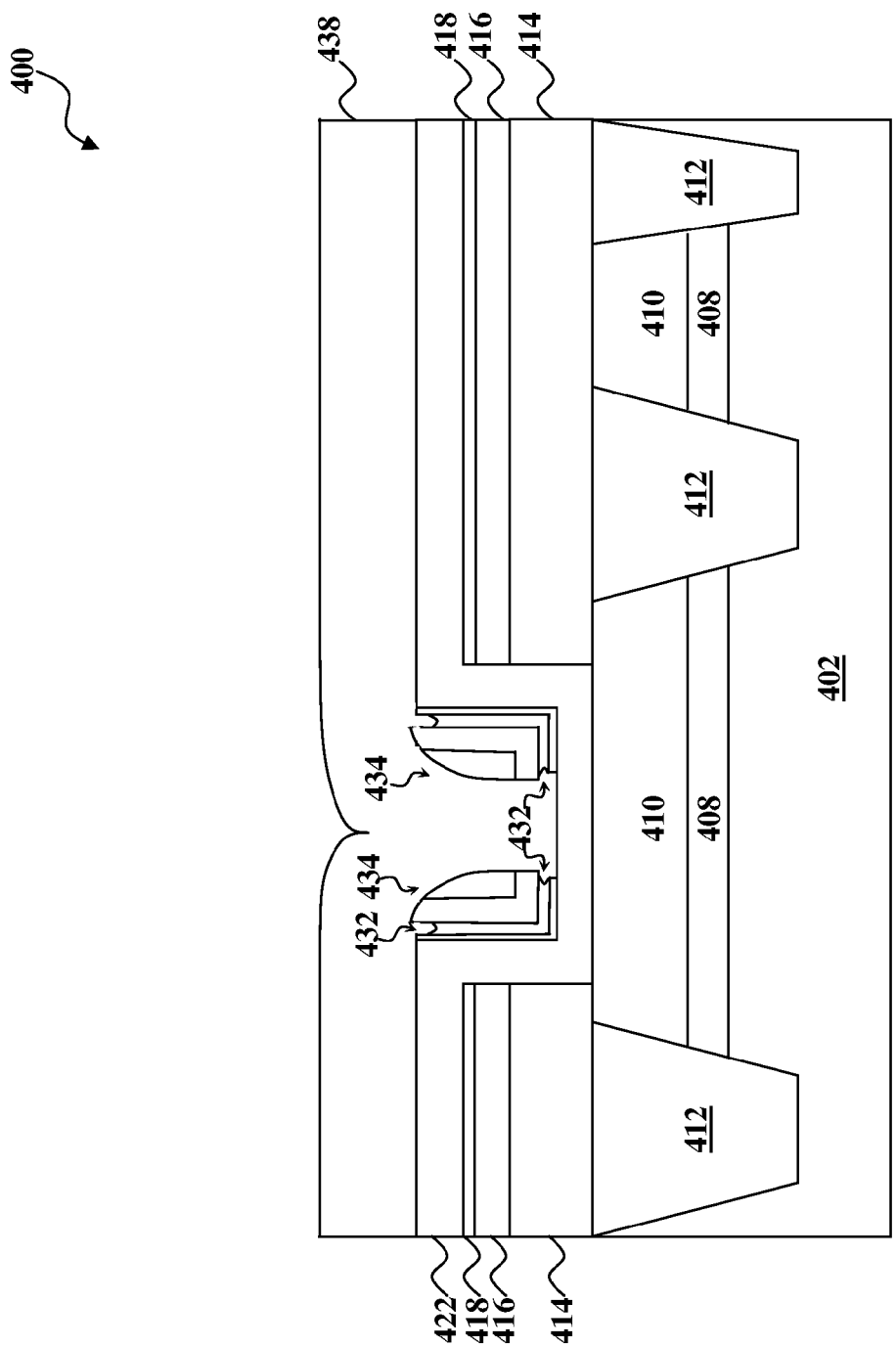
Figure 20:
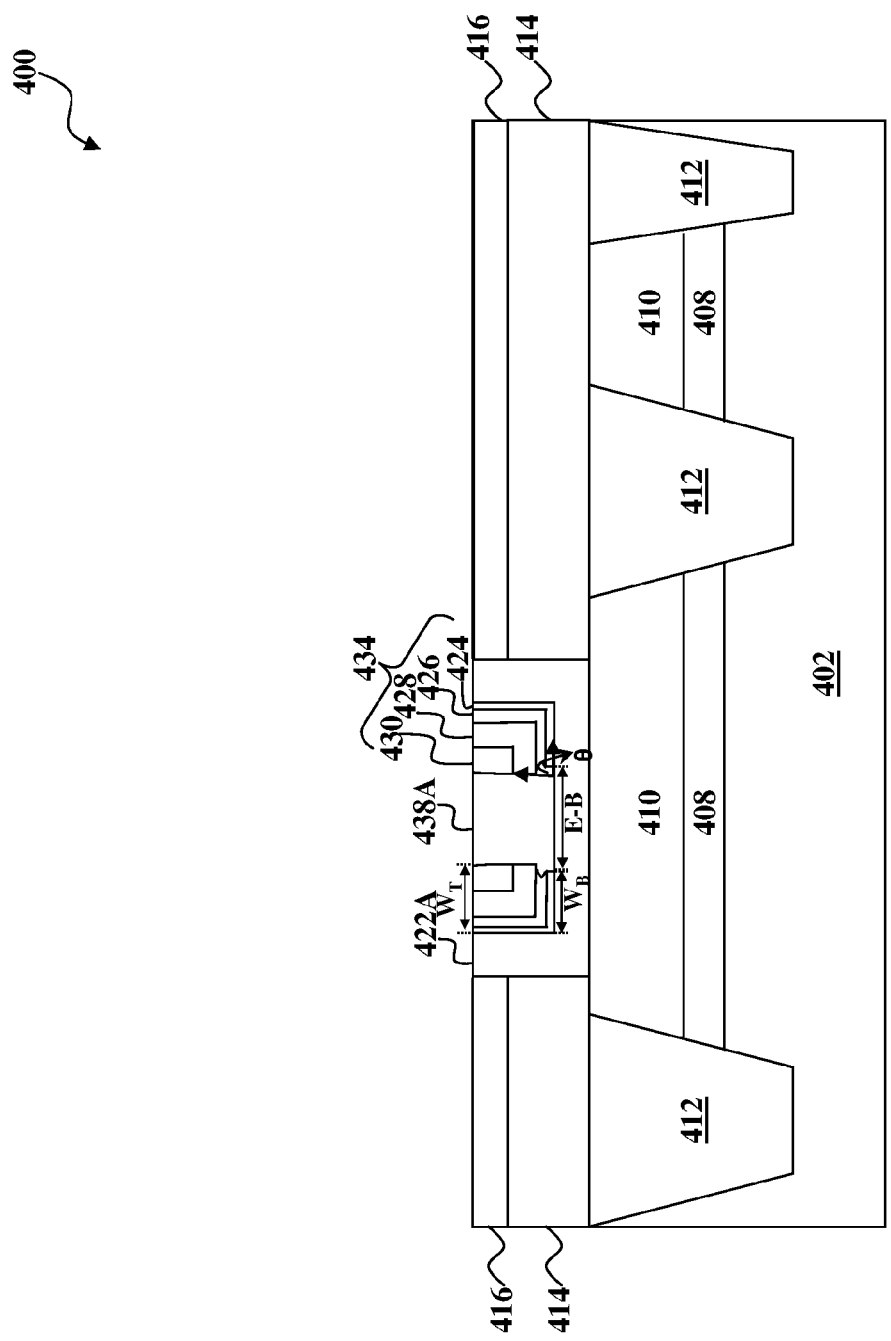

Referring to FIGS. 19 and 20, a base and emitter of the BJT device 400 are formed. In FIG. 19, an emitter layer 438 is formed over the base layer 422 and spacers 434, filling the trench 436. In the depicted embodiment, the emitter layer 438 is a polysilicon layer. The emitter layer 438 may be doped during formation or after formation, for example, by an ion implantation process. Thereafter, in FIG. 20, a chemical mechanical polishing (CMP) process is performed until the dielectric layer 416 is reached, forming an emitter 438A and a base 422A of the BJT device 400. The dielectric layer 416 (silicon nitride layer) can act as an etch stop layer during the CMP process. In the BJT device 400, the spacers 434 include a top width $W_T$ and a bottom width $W_B$. The top width $W_T$ is about 40 nm to about 60 nm, and the bottom width $W_B$ is about 50 nm to about 70 nm. The bottom width $W_B$ is substantially equal to the top width $W_T$. For example, in the depicted embodiment, the bottom width $W_B$ is about 60 nm and the top width $W_T$ is about 50 nm. Alternatively, the bottom width $W_B$ is substantially equal to the top width $W_T$ when a ratio between the top width $W_T$ and the bottom width $W_B$ is about 1:1.5 or less. The substantially equal top and bottom width of the spacers 434 enlarges the emitter-to-base, E-B, contact area between the emitter 438A and base 422A, and also enlarges a top area of the emitter 438A, allowing larger area for landing a contact to the emitter 438A. Further, in the depicted embodiment, the spacers 438 have a substantially non-tapered profile. For example, a taper angle $\theta$ is greater than or equal to about 85°.

By providing the spacers 434 with substantially equivalent bottom and top widths and a substantially non-tapered profile, the BJT device 400 exhibits reduced resistance and improved isolation. Similarly to the BJT device 200, the disclosed BJT device 400 includes spacers 434 with substantially equivalent bottom and top widths, where the spacers 434 exhibit substantially non-tapered profiles (for example, a substantially rectangular or square shape). The increased top width of the spacers 434 enhances isolation between top portions of the emitter 438A and base 422A, and the decreased bottom width decreases resistance between bottom portions of the emitter 438A and base 422A. In the depicted embodiment, the BJT device 400 is fabricated by the method 300, where a PE oxide layer is added over the TEOS formed oxide layer when forming the spacers 434. The PE oxide layer provides the hang-over structure illustrated in FIG. 15. The hang-over structure contributes to the increased top width of the spacers 434. Further, the method 300 implements a wet etching process when removing portions of the silicon nitride layer to form the spacers 434. The wet etching process contributes to the decreased bottom width of the spacers 434.

The BJT device 400 may include additional features, which may be formed by subsequent processing. For example, contacts to the base 422A, emitter 438A, and collector region of the substrate 402 may be formed. Various contacts/vias/lines and multilayer interconnect features (e.g., metal layers and interlayer dielectrics) may be formed over the substrate 402, configured to connect the various features or structures of the BJT device 400. The additional features may provide electrical interconnection to the device 400. For example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

In summary, the disclosed BJT devices 200 and 400 provide improved device performance. The disclosed methods 100 and 300, alone or in combination, can be used to fabricate the BJT devices 200 and 400. The BJT devices 200 and 400 serve only as examples. The BJT devices 200 and 400 may be used in various applications such as digital circuitry, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other types of transistors, including single-gate transistors, double-gate transistors, and other multiple-gate transistors, and may be employed in many different applications, including sensor cells, memory cells, logic cells, and others. Further, it is understood that different embodiments may have different advantages, and that no particular advantage is necessarily required of any embodiment.

The present disclosure provides for many different embodiments. For example, in an embodiment, a method includes providing a semiconductor substrate having a collector region; forming a first semiconductor layer over the semiconductor substrate; forming a first dielectric layer over the first semiconductor layer; forming a second semiconductor layer over the first dielectric layer; and forming a second dielectric layer over the second semiconductor material. The method further includes forming a trench in the second dielectric layer, second semiconductor layer, and first dielectric layer, thereby exposing a portion of the first semiconductor layer; forming dummy spacers in the trench; thereafter, removing the exposed portion of the first semiconductor layer, thereby extending the trench and exposing a portion of the semiconductor substrate having the collector region; thereafter, removing the dummy spacers and the second dielectric layer; and thereafter, forming a base structure, spacers, and an emitter structure in the trench. The first semiconductor layer may be a polysilicon layer, the first and second dielectric layers may be a silicon nitride layer, and the second semiconductor layer may be an amorphous polysilicon layer.

Forming dummy spacers in the trench may include forming a silicon nitride layer over the semiconductor substrate, the silicon nitride layer partially filling the trench, and performing a dry etching process on the silicon nitride layer. Removing the dummy spacers and the second dielectric layer may include performing a wet etching process. Forming the base structure, spacers, and emitter structure may include forming a base layer over the semiconductor substrate, the base layer partially filling the trench; forming a spacer layer over the base layer, the spacer layer partially filling the trench; performing an etching process on the spacer layer; forming an emitter layer over the base layer and the etched spacer layer, the emitter layer completely filling the trench; and performing a chemical mechanical polishing (CMP) process on the emitter layer, spacer layer, and base layer. The second semiconductor layer may be removed by the CMP process includes removing the second semiconductor layer.

In another embodiment, a method includes providing a semiconductor substrate having a collector region; forming a semiconductor layer over the semiconductor substrate; forming a material layer over the semiconductor layer; forming a trench in the semiconductor layer and material layer, wherein sidewalls of the trench are defined by the semiconductor and material layers and a bottom of the trench is defined by a portion of the semiconductor substrate having the collector region; forming a base structure in the trench, wherein the base structure has sidewall portions disposed on the sidewalls of the trench and a bottom portion disposed over the portion of the semiconductor substrate having the collector region; forming spacers in the trench, the spacers being disposed on sidewall portions of the base structure; and forming an emitter structure in the trench, the emitter structure being disposed adjacent to the spacers and over the bottom portion of the base structure.

Forming the spacers includes forming a first oxide layer over the base structure using a first deposition process; forming a nitride layer over the first oxide layer; forming a second oxide layer over the nitride layer using the first deposition process; forming a third oxide layer over the second oxide layer using a second deposition process, the second deposition process being different than the first deposition process; performing a first etch of the third and second oxide layers; performing a second etch of the nitride layer, and performing a third etch of the first oxide layer. The first deposition process may be a chemical vapor deposition (CVD) process using a tetra-ethyl-ortho-silicate (TEOS) precursor, and the second deposition process may be a plasma enhanced CVD process. In an example, the first etch is a dry etching process, and the second and third etches are wet etching processes.

A bipolar junction transistor device is formed by the disclosed methods. In an embodiment, a bipolar junction transistor (BJT) includes a semiconductor substrate having a collector region and a material layer disposed over the semiconductor substrate. The material layer may include a semiconductor layer disposed over the semiconductor substrate and a dielectric layer disposed over the semiconductor layer. The material layer has a trench therein that exposes a portion of the collector region. A base structure, spacers, and emitter structure are disposed within the trench of the material layer. The base structure has sidewall portions disposed on sidewalls of the trench and a bottom portion disposed over the exposed portion of the collector region, the spacers are disposed adjacent to the sidewall portions of the base structure, and the emitter structure is disposed adjacent to the spacers and over the bottom portion of the base structure. Each spacer has a top width and a bottom width, the top width being substantially equal to the bottom width. Each spacer having the top width being substantially equal to the bottom width may have a ratio of the top width to the bottom width that is less than or equal to 1:1.5. A taper angle of each spacer may be greater than or equal to about 85°. A bottom portion of each spacer may include a notch that extends away from the emitter structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a semiconductor substrate having a collector region;
forming a first semiconductor layer over the semiconductor substrate;
forming a first dielectric layer over the first semiconductor layer;
forming a second semiconductor layer over the first dielectric layer;
forming a second dielectric layer over the second semiconductor material;
forming a trench in the second dielectric layer, second semiconductor layer, and first dielectric layer, thereby exposing a portion of the first semiconductor layer;
forming dummy spacers in the trench;
thereafter, removing the exposed portion of the first semiconductor layer, thereby extending the trench and exposing a portion of the semiconductor substrate having the collector region;
thereafter, removing the dummy spacers and the second dielectric layer; and
thereafter, forming a base structure, spacers, and an emitter structure in the trench.

2. The method of claim 1 wherein:
the forming the first semiconductor layer includes forming a polysilicon layer;
the forming the first dielectric layer includes forming a silicon nitride layer;
the forming the second semiconductor layer includes forming an amorphous polysilicon layer; and
the forming the second dielectric layer includes forming a silicon nitride layer.

3. The method of claim 1 wherein the forming dummy spacers in the trench includes:
forming a silicon nitride layer over the semiconductor substrate, the silicon nitride layer partially filling the trench; and
performing a dry etching process on the silicon nitride layer.

4. The method of claim 3 wherein the removing the dummy spacers and the second dielectric layer includes performing a wet etching process.

5. The method of claim 1 wherein:
the forming the dummy spacers includes forming the dummy spacers over an extension portion of the exposed portion of the first semiconductor layer, such that the dummy spacers protect the extension portion during the removing the exposed portion of the first semiconductor layer; and
the removing the dummy spacers includes exposing the extension portion of the first semiconductor layer, such that the first semiconductor layer extends a distance beyond the first dielectric layer into the trench.

6. The method of claim 1 wherein the forming the base structure, spacers, and emitter structure includes:
forming a base layer over the semiconductor substrate, the base layer partially filling the trench;
forming a spacer layer over the base layer, the spacer layer partially filling the trench;
performing an etching process on the spacer layer;
forming an emitter layer over the base layer and the etched spacer layer, the emitter layer completely filling the trench; and
performing a chemical mechanical polishing (CMP) process on the emitter layer, spacer layer, and base layer.

7. The method of claim 6 wherein the performing the CMP process includes removing the second semiconductor layer.

8. The method of claim 6 wherein:
the forming the base layer includes forming a silicon germanium (SiGe) layer;
the forming the spacer layer includes forming an oxide-nitride-oxide layer; and
the forming the emitter layer includes forming a polysilicon layer.

9. A method comprising:
providing a semiconductor substrate having a collector region;

forming a semiconductor layer over the semiconductor substrate;

forming a material layer over the semiconductor layer;

forming a trench in the semiconductor layer and material layer, wherein sidewalls of the trench are defined by the semiconductor and material layers and a bottom of the trench is defined by a portion of the semiconductor substrate having the collector region;

forming a base structure in the trench, wherein the base structure has sidewall portions disposed on the sidewalls of the trench and a bottom portion disposed over the portion of the semiconductor substrate having the collector region;

forming spacers in the trench, the spacers being disposed on sidewall portions of the base structure, wherein the forming the spacers includes:

forming a first oxide layer over the base structure using a first deposition process;

forming a nitride layer over the first oxide layer, forming a second oxide layer over the nitride layer using the first deposition process, forming a third oxide layer over the second oxide layer using a second deposition process, the second deposition process being different than the first deposition process, performing a first etch of the third and second oxide layers, performing a second etch of the nitride layer, and performing a third etch of the first oxide layer; and forming an emitter structure in the trench, the emitter structure being disposed adjacent to the spacers and over the bottom portion of the base structure.

10. The method of claim 9 wherein:

the forming the first and second oxide layer using the first deposition process includes performing a chemical vapor deposition (CVD) process using a tetra-ethyl-ortho-silicate (TEOS) precursor; and the forming the third oxide layer using the second deposition process includes using a plasma enhanced CVD process.

11. The method of claim 9 wherein the performing the first etch includes performing a dry etching process.

12. The method of claim 9 wherein the performing the second etch includes performing a wet etching process.

13. The method of claim 12 wherein the performing the wet etching process includes utilizing a $H_3PO_4$ etching solution.

14. The method of claim 12 wherein the performing the wet etching process includes forming notched spacer portions at a bottom of the spacers.

15. The method of claim 9 wherein the performing the third etch includes performing a wet etching process.

16. The method of claim 9 wherein:

the material layer includes a nitride layer over the semiconductor layer and an amorphous polysilicon layer over the semiconductor layer; and the forming the emitter structure in the trench includes:

forming a polysilicon layer over the material layer, wherein the polysilicon layer fills the trench, and performing a chemical mechanical polishing (CMP) process, wherein the CMP process stops at the nitride layer of the material layer.

17. A bipolar junction transistor (BJT) comprising:

a semiconductor substrate having a collector region;

a material layer including a semiconductor layer disposed over the semiconductor substrate and a dielectric layer disposed over the semiconductor layer, wherein the material layer has a trench therein that exposes a portion of the collector region; and a base structure, spacers, and emitter structure disposed within the trench of the material layer, wherein:

the base structure has sidewall portions disposed on sidewalls of the trench and a bottom portion disposed over the exposed portion of the collector region;

the spacers are disposed adjacent to the sidewall portions of the base structure, each spacer having a top width and a bottom width, the top width being substantially equal to the bottom width, and the emitter structure is disposed adjacent to the spacers and over the bottom portion of the base structure, wherein the spacers prevent the emitter structure from physically contacting the dielectric layer disposed over the semiconductor layer.

18. The BJT of claim 17 wherein each spacer having the top width being substantially equal to the bottom width includes a ratio of the top width to the bottom width being less than or equal to 1:1.5.

19. The BJT of claim 17 wherein a taper angle of each spacer is greater than or equal to about 85°.

20. The BJT of claim 17 wherein a bottom portion of each spacer includes a notch, the notch extending away from the emitter structure.

* * * * *